United States Patent
Oda

(10) Patent No.: US 7,276,695 B2
(45) Date of Patent: Oct. 2, 2007

(54) BOLOMETER INFRARED DETECTOR AND AFTERIMAGE REDUCTION METHOD

(75) Inventor: Naoki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 300 days.

(21) Appl. No.: 11/149,240

(22) Filed: Jun. 10, 2005

(65) Prior Publication Data

US 2005/0274892 A1 Dec. 15, 2005

(30) Foreign Application Priority Data

Jun. 10, 2004 (JP) ............................ 2004-172688

(51) Int. Cl.
*G01J 5/02* (2006.01)

(52) U.S. Cl. ............ 250/330; 250/339.03; 250/339.04; 250/352; 250/332

(58) Field of Classification Search ........... 250/339.03, 250/339.04, 330, 352, 332
See application file for complete search history.

(56) References Cited

U.S. PATENT DOCUMENTS

| | | | |
|---|---|---|---|
| 6,133,572 A * | 10/2000 | Cunningham | 250/339.03 |
| 6,437,331 B1 * | 8/2002 | Kawano | 250/338.3 |
| 7,105,821 B1 * | 9/2006 | Kennedy et al. | 250/339.07 |
| 2002/0040967 A1* | 4/2002 | Oda | 250/338.1 |
| 2003/0042421 A1* | 3/2003 | Oda | 250/352 |
| 2003/0213910 A1* | 11/2003 | Anderson et al. | 250/338.1 |

FOREIGN PATENT DOCUMENTS

JP 2002-71452 A 3/2002

OTHER PUBLICATIONS

C. Marshall et al. "Uncooled Infrared Sensor With Digital Focal Plane Array", SPIE vol. 2746; pp. 23-31, 1996.

* cited by examiner

*Primary Examiner*—David Porta
*Assistant Examiner*—Djura Malevic
(74) *Attorney, Agent, or Firm*—Sughrue Mion Pllc.

(57) ABSTRACT

A bolometer infrared detecting element has a thermal isolation structure in which a temperature detector comprising a bolometer thin film is held floating from a circuit substrate by beams. As infrared rays incident on the temperature detector or reflected by an infrared reflector are absorbed by a protective film and the bolometer thin film, the temperature of the bolometer thin film rises, and the temperature rise is detected as a change in resistance. When a high temperature object whose temperature is equal to or higher than a predetermined temperature or whose output voltage is equal to or higher than a value corresponding to the predetermined temperature is detected, a control temperature setter or a pulse bias setter performs control in such a way as to raise the temperature of a Peltier device stepwise or in a pulse form, or to increase the width of a pulse of pulse bias, or to increase the voltage value of the pulse. This makes it possible to raise the temperature of the infrared detecting element, thereby reducing an afterimage.

10 Claims, 15 Drawing Sheets

TO OUTSIDE CIRCUIT

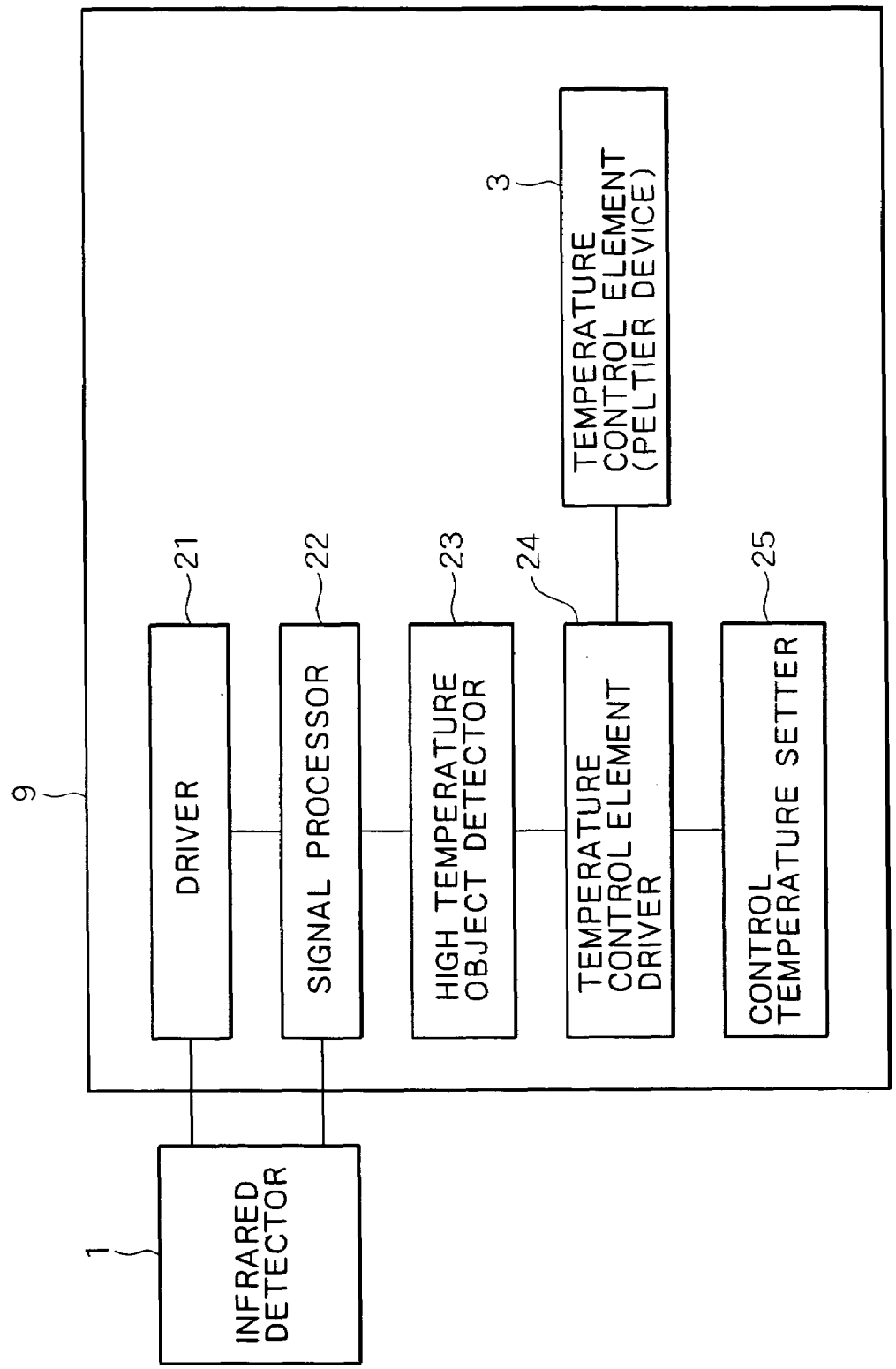

INFRARED IMAGE DURING BLACK BODY (505K) IMAGING

INFRARED IMAGE 30 SECONDS AFTER BLACK BODY (505K) IMAGING FOR 3 MINUTES

INFRARED IMAGE 240 SECONDS AFTER BLACK BODY (505K) IMAGING FOR 3 MINUTES

FIG. 15A  BRIGHTNESS DISTRIBUTION ALONG 75TH LINE
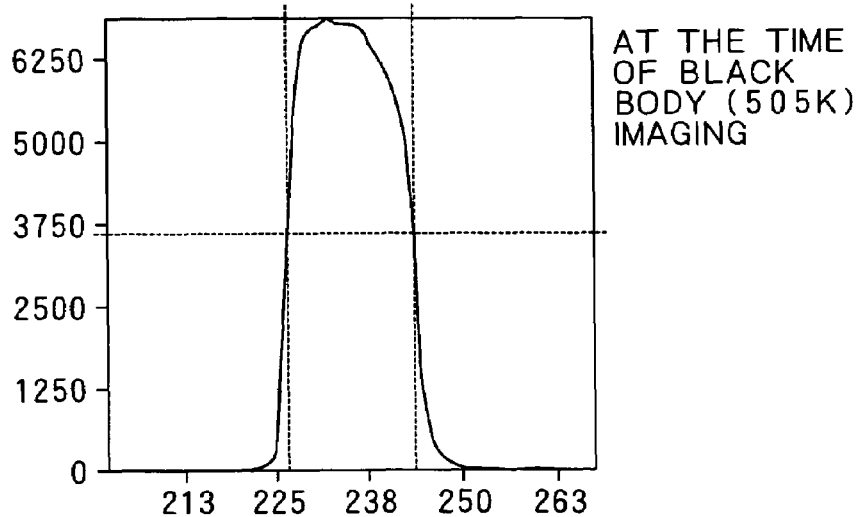
AT THE TIME OF BLACK BODY (505K) IMAGING
FIG. 15B
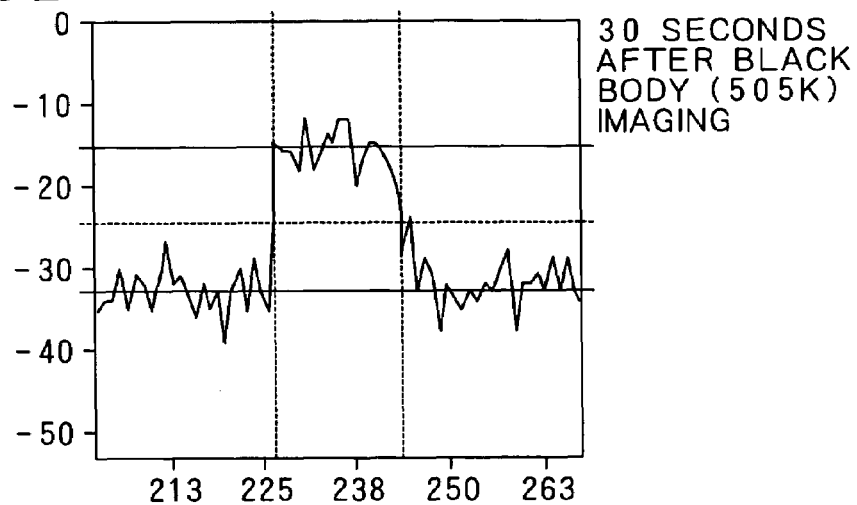
30 SECONDS AFTER BLACK BODY (505K) IMAGING
FIG. 15C
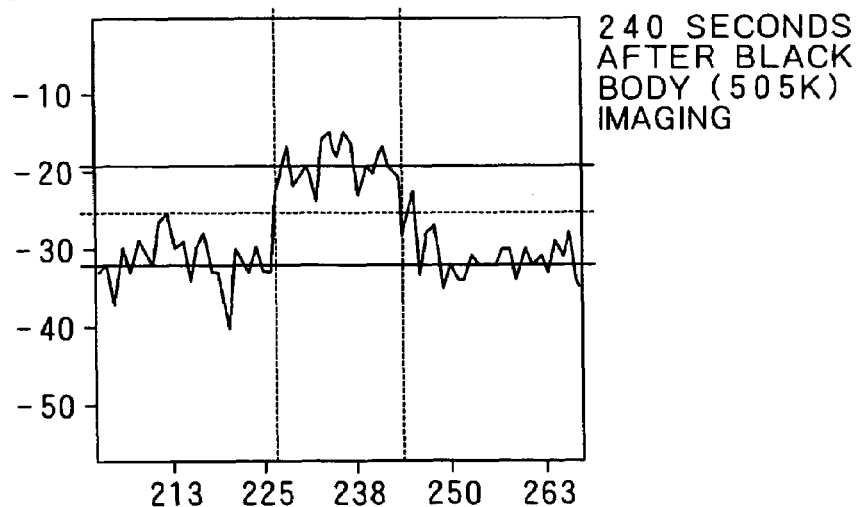
240 SECONDS AFTER BLACK BODY (505K) IMAGING

BOLOMETER INFRARED DETECTOR AND AFTERIMAGE REDUCTION METHOD

BACKGROUND OF THE INVENTION

1. Technical Field of the Invention

The present invention relates to a bolometer infrared detector that detects infrared rays with a thermal resistance element formed in a thermal isolation structure, and, more particularly, to a bolometer infrared detector comprising a part which reduces an afterimage and an afterimage reduction method which uses the bolometer infrared detector.

2. Description of the Related Art

The infrared detector is divided broadly into a quantum detector which uses a band structure of a semiconductor and so on, and a thermal detector which uses a heat-originated change in material properties such as a resistance and a dielectric constant. The former detector has high sensitivity but needs to be cooled according to the operational principles, whereas the latter, which is called an uncooled detector because it does not require cooling, has many advantages over the quantum detector in production cost and maintenance cost. Thus, the uncooled detector is becoming the mainstream of infrared detectors.

There are a bolometer detector, a pyroelectric detector, and a thermocouple detector as thermal infrared detectors. Generally, each type of detector has a thermal isolation structure, a so-called diaphragm structure, in order to enhance the sensitivity of the detector. The bolometer infrared detector is comparatively superior in its characteristics. Especially, bolometer infrared detectors using vanadium oxide (VOx) as a bolometer material are used as imaging devices which are arrayed in two dimensions to acquire infrared images, as shown in SPIE (year 1996, volume 2746, page 23). The above-described bolometer infrared detector will be explained with reference to FIGS. 1A and 1B. FIG. 1A is a cross sectional view showing an infrared detector 1. FIG. 1B is a cross sectional view showing an infrared detecting element 2 shown in FIG. 1A.

As shown in FIG. 1B, in the device section of the bolometer infrared detector, an infrared reflecting film 12 which reflects infrared rays and a protective film 13 are formed on a circuit substrate 11 in which a readout circuit 11a is formed by a CMOS process. On the infrared reflecting film 12, separated by a cavity 14, a temperature detector 19 comprising a bolometer thin film 16 made of a bolometer material, an electrode 17 connected to an end of the bolometer thin film 16, and a protective film 15 covering those mentioned is formed. The temperature detector 19 is held in air by beams 18 consisting of the electrode 17 and the protective film 15 covering the electrode 17. The electrode 17 is connected to a contact 11b on the circuit substrate 11, and the contact 11b is connected to the readout circuit 11a electrically.

As shown in FIG. 1A, the elements having such a thermal isolation structure are arrayed in a two-dimensional array to constitute the infrared detecting element 2. The infrared detecting element 2 is mounted on a temperature control element such as a Peltier device 3 and is controlled to a constant temperature. The infrared detecting element 2 and the Peltier device 3 are sealed in vacuum by a vacuum package comprising a package 4, a cap 5, an infrared-transparent window 6, and an exhaust pipe 7, and their input and output signals are connected via pins 8 to an external circuit of such as a driver, a signal processor, and a temperature control element driver provided outside.

Infrared rays made incident through an optical system are absorbed partly by the protective film 15 and the bolometer thin film 16 of each infrared detecting element 2, and the remainder passes through them and is reflected by the infrared reflecting film 12 to be made incident on the temperature detector 19 again and absorbed again. The absorbed infrared rays heat the temperature detector 19 and change the resistance of the bolometer thin film 16 (thermal resistance) in the temperature detector 19. As a bias current from the readout circuit 11a is supplied, the resistance change is read out as a voltage change so that the temperature of a subject is measured.

Japanese Published Unexamined Patent Application No. 2002-71452 discloses a thermal infrared detector having a similar bolometer thin film. In order to suppress the drift of the output of the detector due to an environmental temperature and self-heating of the detector, this thermal infrared detector comprises a first temperature detector and a second temperature detector at each of pixels arranged in an array, and both of the temperature detectors have the bolometer thin films which are formed floating from substrate by the beams so that both temperature detectors are thermally separated from the substrate. Eaves are provided so as to extend outward from both ends of the first temperature detector in such a way as not to touch the beams and the second temperature detector. The infrared reflector is formed on an upper layer of the second temperature detector. By setting thermal capacities of the eaves and the infrared reflector approximately equal to each other, the influence of the temperature change due to the environmental temperature and the self-heating of both temperature detectors is cancelled, so that only signals originated from infrared rays made incident on the first temperature detector and the eaves are taken out.

However, these conventional infrared detectors have problems as follows. It is generally known that an imaging device which images a subject with light receiving elements suffers a phenomenon that the image of a certain object imaged is also observed even after the object has been removed (the phenomenon will hereinafter be referred to as an afterimage) due to the characteristic of light receiving elements or the characteristic of a signal processing circuit. It is also known that with the use of the bolometer infrared detector 1, an afterimage appears at a place where an object with a certain temperature, especially a high temperature, is imaged. The time when the afterimage appears depends on the temperature of the high temperature object and the imaging time of the high temperature object. When a high temperature object of about 500 K is imaged for about 3 minutes, for example, several minutes are required for the level of the afterimage to become equal to or less than the NETD (Noise Equivalent Temperature Difference), raising a serious problem for a system which acquires a heat image in real time. Therefore, there is a demand for a bolometer infrared detector 1 which can reduce an afterimage.

SUMMARY OF THE INVENTION

An object of the present invention is to provide a bolometer infrared detector that can reduce an afterimage which appears when a high temperature object is imaged and an afterimage reduction method using the bolometer infrared detector.

A bolometer infrared detector according to the first aspect of the present invention comprises an infrared detecting element including a substrate, and a diaphragm having a bolometer thin film and supported on the substrate by beams; a high temperature object detector which detects, in a subject, a high temperature object whose temperature is equal to or higher than a predetermined temperature or a high temperature object whose output voltage is equal to or higher than a predetermined value corresponding to the predetermined temperature; and a controller which raises a temperature of the infrared detecting element at least for a certain time when the high temperature object is detected.

A bolometer infrared detector according to the second aspect of the present invention comprises an infrared detecting element including a substrate, and a diaphragm having a bolometer thin film and supported on the substrate by beams; a temperature controller which controls a temperature of the infrared detecting element; a high temperature object detector which detects, in a subject, a high temperature object whose temperature is equal to or higher than a predetermined temperature or a high temperature object whose output voltage is equal to or higher than a predetermined value corresponding to the predetermined temperature with reference to an output signal from the infrared detecting element; and a control temperature setter which performs control when the high temperature object is detected in such a way as to raise a control temperature of the temperature controller by a predetermined temperature or to raise the control temperature of the temperature controller by a predetermined temperature and to set the control temperature back to an original temperature after a certain time elapses.

A bolometer infrared detector according to the third aspect of the present invention comprises an infrared detecting element including a substrate, and a bolometer thin film and supported on the substrate by beams and driven by a pulsed bias voltage; a high temperature object detector which detects, in a subject, a high temperature object whose temperature is equal to or higher than a predetermined temperature or a high temperature object whose output voltage is equal to or higher than a predetermined value corresponding to the predetermined temperature with reference to an output signal from the infrared detecting element; and a pulse bias setter which performs control when the high temperature object is detected in such a way as to increase a width of the pulse by a predetermined time or increase a peak voltage of the pulse by a predetermined voltage, and to set the width of the pulse back to an original width or to set the peak voltage of the pulse back to an original voltage after a certain time elapses.

An afterimage reduction method according to the fourth aspect of the present invention using a bolometer infrared detector comprising an infrared detecting element including a substrate, and a diaphragm having a bolometer thin film and supported on the substrate by beams, comprises the steps of: detecting, in a subject, a high temperature object whose temperature is higher than a predetermined temperature or a high temperature object whose output voltage is higher than a predetermined value corresponding to the predetermined temperature; and raising a temperature of the infrared detecting element at least for a certain time when the high temperature object is detected.

An afterimage reduction method according to the fifth aspect of the present invention using a bolometer infrared detector comprising an infrared detecting element including a substrate, and a diaphragm having a bolometer thin film and supported on the substrate by beams, and a temperature controller which controls a temperature of the infrared detecting element to a predetermined temperature, comprises the steps of: detecting, in a subject, a high temperature object whose temperature is equal to or higher than a predetermined temperature or a high temperature object whose output voltage is equal to or higher than a predetermined value corresponding to the predetermined temperature with reference to an output signal from the infrared detecting element; raising a control temperature of the temperature controller by a predetermined temperature when the high temperature object is detected; and, if necessary, setting the control temperature back to an original temperature after a certain time elapses.

An afterimage reduction method according to the sixth aspect of the present invention using a bolometer infrared detector comprising an infrared detecting element including a substrate, and a diaphragm having a bolometer thin film and supported on the substrate by beams, and a temperature controller which controls a temperature of the infrared detecting element to a predetermined temperature, comprises the steps of: detecting, in a subject, a high temperature object whose temperature is equal to or higher than a predetermined temperature or a high temperature object whose output voltage is equal to or higher than a predetermined value corresponding to the predetermined temperature with reference to an output signal from the infrared detecting element; raising a control temperature of the temperature controller by a predetermined temperature when the high temperature object is detected; and setting the control temperature back to an original temperature after a certain time elapses.

An afterimage reduction method according to the seventh aspect of the present invention using a bolometer infrared detector comprising an infrared detecting element which includes a substrate, and a diaphragm having a bolometer thin film and supported on the substrate by beams and is driven by a pulsed bias voltage, comprises the steps of: detecting, in a subject, a high temperature object whose temperature is equal to or higher than a predetermined temperature or a high temperature object whose output voltage is equal to or higher than a predetermined value corresponding to the predetermined temperature with reference to an output signal from the infrared detecting element; increasing a width of the pulse by a predetermined time or increasing a peak voltage of the pulse by a predetermined voltage when the high temperature object is detected; and setting the width or the peak voltage of the pulse back to an original width or original voltage after a certain time elapses.

According to the present invention with the configuration described above, when the detector detects a high temperature object whose temperature is equal to or higher than a predetermined temperature or whose output voltage is equal to or higher than a predetermined value corresponding to the predetermined temperature, the control temperature setter or the pulse bias setter raises the control temperature of the temperature controller (temperature control element) stepwise, or raises the control temperature in a pulse form, or increases the width of a pulse of pulse bias applied to the infrared detecting element, or makes pulse voltage (peak voltage) high, so that the temperature of the infrared detecting element rises, thereby reducing an afterimage.

BRIEF DESCRIPTION OF THE DRAWINGS

FIG. 2 is a block diagram showing the configuration of an external circuit of the infrared detector according to a first embodiment of the present invention;

FIGS. 15A, 15B, and 15C are graphs showing variations of brightness distribution of the afterimages with the time.

THE DETAILED DESCRIPTION OF THE PREFERRED EMBODIMENTS

Figure 1A:
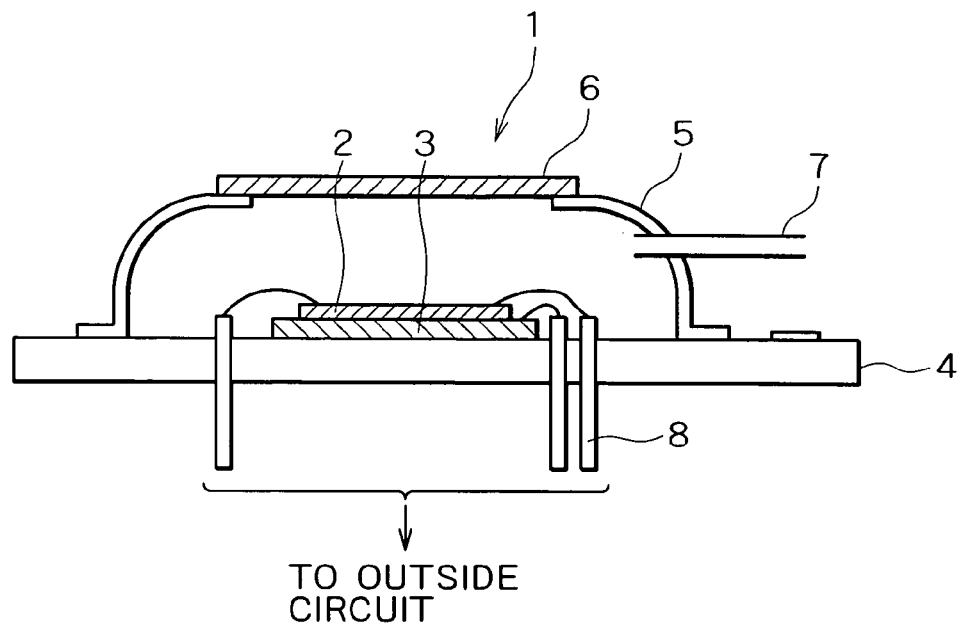
FIGS. 1A and 1B are cross sectional views exemplarily showing the structures of an infrared detector and an infrared detecting element of the present invention, respectively.

Preferred embodiments of the present invention will be explained below. First, experiment results which contribute to the completion of the present invention will be explained, and the principle of the present invention will be explained. As stated above, the bolometer infrared detecting element 2 shown in FIG. 1B has the thermal isolation structure in which the temperature detector 19 comprising the bolometer thin film 16 is held floating from the circuit substrate 11 by the beams 18. Infrared rays incident on the temperature detector 19 or reflected by the infrared reflecting film 12 are absorbed by the protective film 15 and the bolometer thin film 16, and the temperature of the bolometer thin film 16 rises, and the temperature rise is detected as a change in resistance.

When strong infrared rays are made incident on the infrared detecting element 2 having such thermal isolation structure from a high temperature object, the temperature of the infrared detecting element 2 rises greatly, and an afterimage appears noticeably. However, because the mechanism of producing the afterimage is not elucidated, one should wait until the afterimage disappears or a process of making the afterimage unnoticeable using a signal processing circuit or the like is usually performed. Because the methods cannot remove the cause for the afterimage, however, the temperature of a subject overlapping the afterimage cannot be precisely detected, and processing the afterimage which changes moment by moment increases the load of signal processing.

Therefore, the inventor of the present invention performed various experiments which will be discussed below to predict the afterimage producing mechanism, and developed a method of reliably reducing an afterimage based on the results. Concrete contents and results of the experiments will be explained below. In the following description, a part which comprises the circuit substrate 11 and the thermal isolation structure formed thereon is called "infrared detecting element 2"; a part which comprises the infrared detecting element 2, a temperature control element such as the Peltier device 3, and the external circuit which controls those components mentioned is called "infrared detector 1"; and a part which comprises the infrared detector 1, an incidence optical system, a member for generating and displaying an infrared image is called "infrared camera", for the sake of convenience.

[First Experiment]

To check if an afterimage was caused by the operation of the infrared camera, a black body of 1000 K was observed in a state where the power supply of the infrared camera was turned off for 3 minutes (in other words, the black-body radiation of 1000 K was made incident on the infrared detecting element) after which the infrared camera power supply was turned on to check if the afterimage appears. As a result, even when a high temperature object was observed while the power supply of the infrared camera was off, the afterimage appeared. If the afterimage were caused by the operation of the infrared camera, it would be considered that the afterimage would not appear when the high temperature object was observed while the power supply was off. From this assumption, it appears that the afterimage is caused by the infrared detector 1 itself.

[Second Experiment]

To examine whether or not the afterimage was associated with the heat that developed in a part of the infrared detector 1, the control temperature of the Peltier device 3 (approximately equal to the temperature of the infrared detecting element 2) was set to individual temperatures of 10° C., 20° C., 30° C., 40° C., and 50° C., and a change in size of the afterimage was examined when a black body of 505 K was imaged at individual temperatures. As a result, the size of the afterimage did not change at the time of imaging the black body of 505 K and at the time of observing the afterimage after the black body had been removed.

[Third Experiment]

In the second experiment, even if the heat generated by the infrared incidence is accumulated in the circuit substrate 11, the heat conducts in the thickness direction of the circuit substrate 11 (direction toward the Peltier device 3), so that the heat does not spread easily in the surface direction of the circuit substrate 11. In this respect, the temperature control of the Peltier device 3 was stopped to intercept the flow of heat in the thickness direction of the circuit substrate 11, and a change in size of the afterimage was examined similarly. As a result, the size of the afterimage did not change. If the afterimage were caused by the heat that was generated in a part where heat was easy to diffuse, such as the circuit substrate 11, it would be considered that the size of the afterimage had changed with the elapse of time. It therefore appears that the afterimage is associated with a part where heat is not easily diffused (for example, the temperature detector 19 which is thermally separated from the circuit substrate 11) based on the results of the second and third experiments.

[Fourth Experiment]

Figure 11:
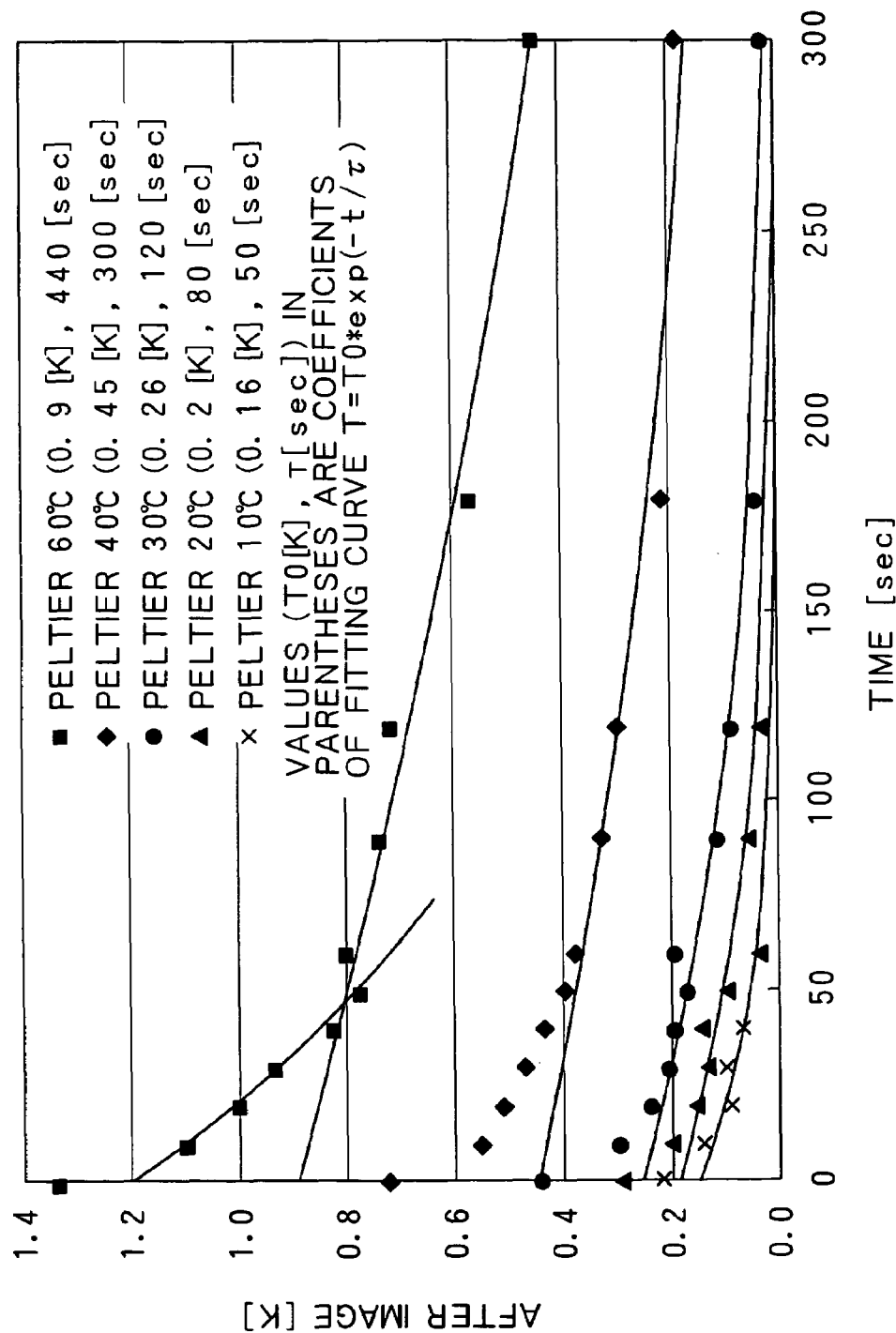
FIG. 11 is a graph showing variations of afterimages with the time at individual set temperatures of the Peltier device.
Figure 12A:
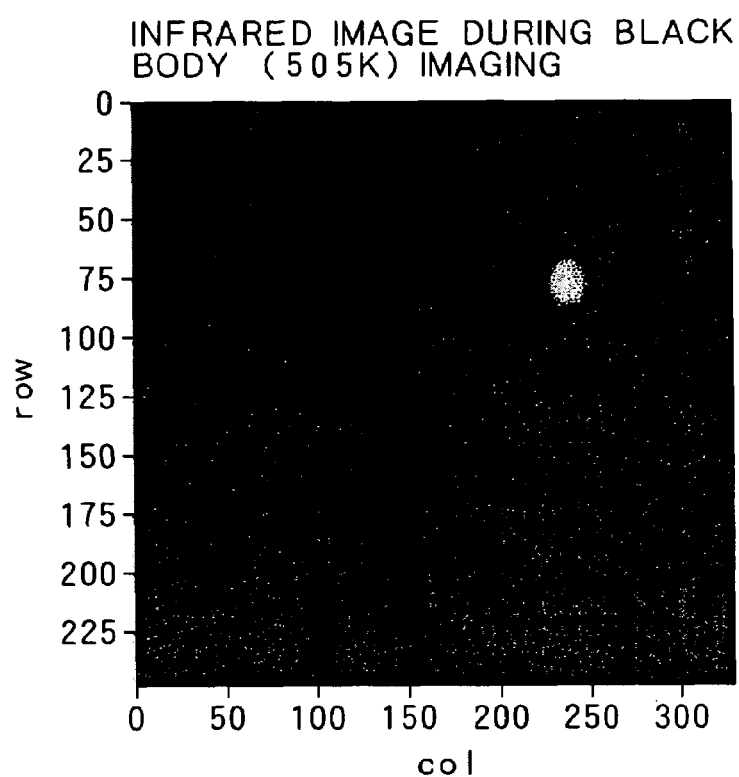
FIGS. 12A and 12B are images showing infrared images at the time of imaging a 505 K black body.
Figure 12B:
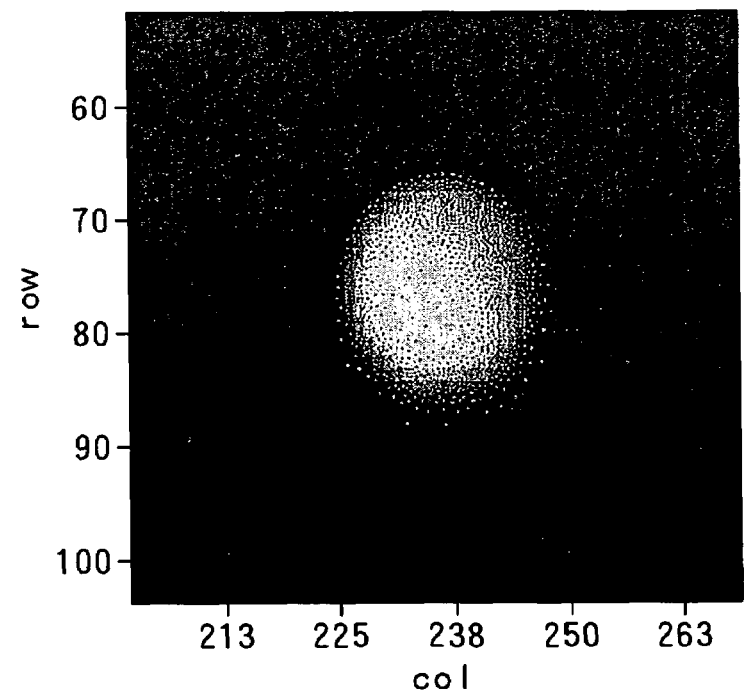
Figure 13A:
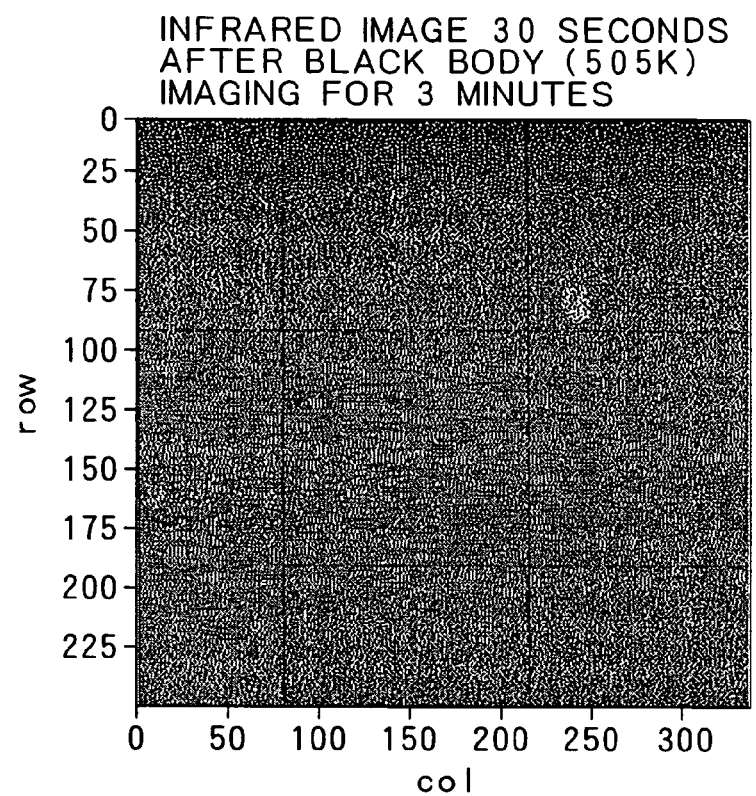
FIGS. 13A and 13B are images showing infrared images 30 seconds after the 505 K black body is imaged.
Figure 13B:
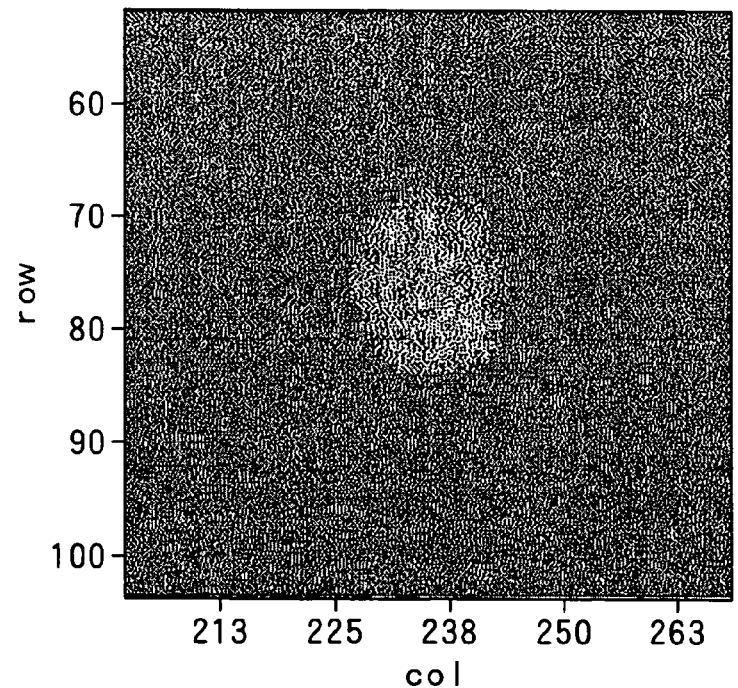
Figure 14A:
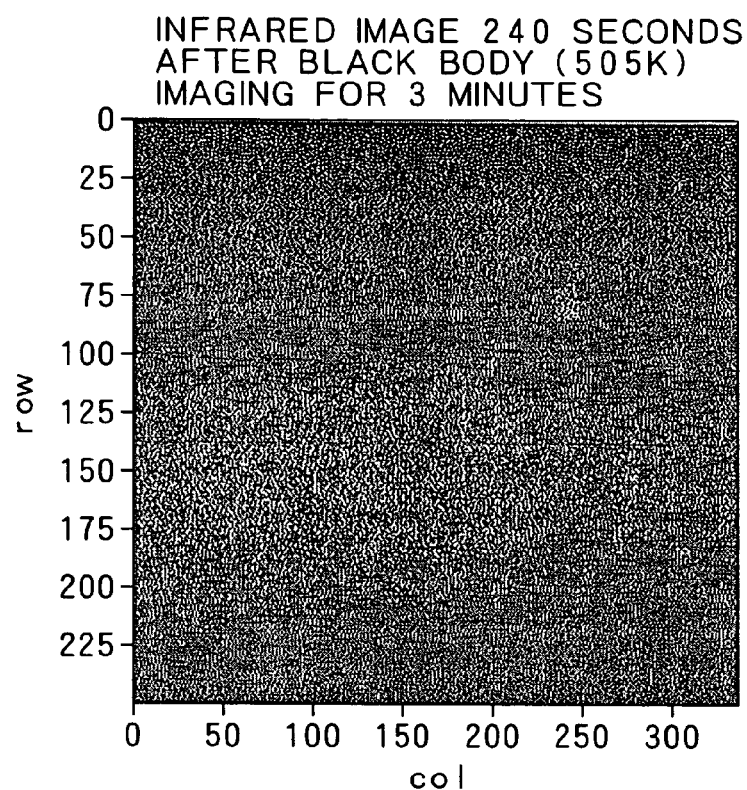
FIGS. 14A and 14B are images showing infrared images 240 seconds after the 505 K black body is imaged.
Figure 14B:
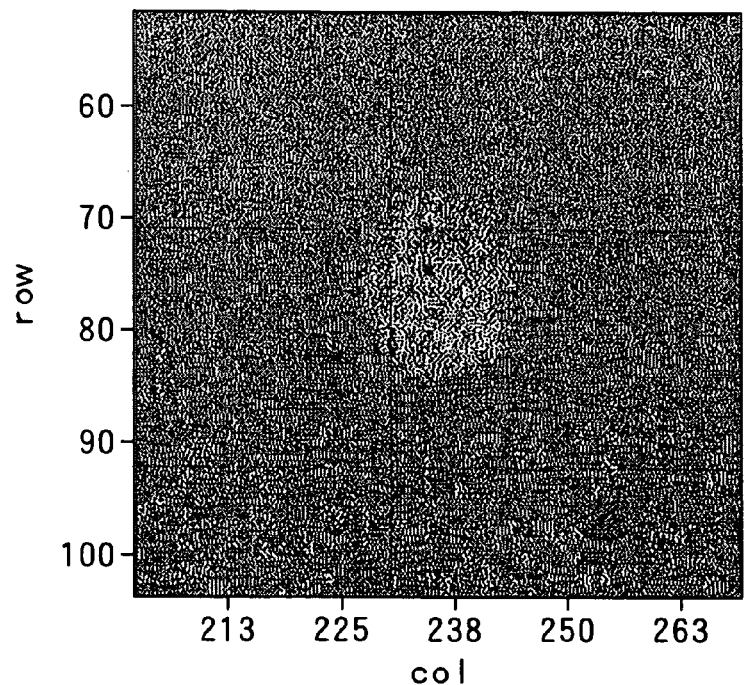

From the results of the second and third experiments it is confirmed that the size of the afterimage does not change as time elapses. To check how the temperature of the afterimage changes with the elapse of time, the control temperature of the Peltier device 3 was set to 10° C., 20° C., 30° C., 40° C. and 50° C., as done in the second experiment, and variations of temperature correction values of the afterimage with the elapse of time after having imaged the black body of 505 K for 3 minutes were measured. The results are shown in FIG. 11. Real infrared images at the time of imaging black body and 30 seconds after and 240 seconds after are shown in FIG. 12 to FIG. 14 (in each of which A shows the whole image and B shows an enlarged image of the black body (the white part)). FIGS. 15A to 15C show brightness distributions along the 75th line of the infrared image. Constants of a fitting curve (a temperature correction value of the afterimage (T0) and a time constant of the afterimage ($\tau$)) at the time of fitting the temperature correction values of the afterimage to $T=T0\times e(-t/\tau)$ were calculated. The results are shown in Table 1 given below. The temperature correction values and the time constant of the afterimage are smaller than experimental values at t=0 because of the use of extrapolation values at t=0 when those elements of the time dependency of the afterimage which have a large time constant are fitted.

TABLE 1

| Temperature of the Peltier device at the time of imaging for 3 minutes - 505 K | Temperature of the Peltier device at the time of afterimage observation | Temperature correction value of the afterimage (T0) | Time constant of the afterimage ($\tau$) |
| --- | --- | --- | --- |
| 10° C. | 10° C. | 0.16° C. | 50 sec |
| 20° C. | 20° C. | 0.2° C. | 80 sec |
| 30° C. | 30° C. | 0.26° C. | 120 sec |
| 40° C. | 40° C. | 0.45, 0.62° C. | 300, 290 sec |
| 50° C. | 50° C. | 0.9, 0.98° C. | 440, 420 sec |

As shown in FIG. 11, the afterimage appears at any control temperature of the Peltier device 3, and the temperature of the afterimage gradually becomes higher as the control temperature of the Peltier device 3 rises. It is apparent from Table 1 that the time constant as well as the temperature correction value of the afterimage becomes larger as the control temperature of the Peltier device 3 rises. While it is not clear as to the causes, however, if the temperature rise by the black-body radiation is the cause, it seems that the difference between temperatures of a part on which the black-body radiation is made incident and a part on which the radiation is not made incident is very small regardless of the control temperature of the Peltier device 3. It certainly appears that this phenomenon is not a matter of a simple temperature rise.

[Fifth Experiment]

Next, if the afterimage is associated with the temperature rise of the infrared detecting element 2, because the heat diffusion changes depending on whether an atmosphere around the infrared detecting element 2 is air or vacuum, it is expected that there would be a difference in the afterimages. In this respect, the extents of the afterimages at the time of imaging a 505 K black body and at the time of afterimage observation with the atmosphere of the infrared detecting element 2 being set to air or vacuum were measured. The results are shown in Table 2.

TABLE 2

| Atmosphere at the time of imaging for 3 minutes - 505 K | Atmosphere at the time of afterimage observation | Afterimage |
| --- | --- | --- |
| Air | Air | None |
| Air | Vacuum | None |
| Vacuum | Vacuum | White, strong afterimage with temperature higher than peripheral temperature |
| Vacuum | Releasing air 10 sec → vacuum | White, strong afterimage with temperature higher than peripheral temperature |
| Vacuum | Releasing air 60 sec → vacuum | White, strong afterimage with temperature higher than peripheral temperature |

As shown in Table 2, when the 505 K black body is imaged in an atmosphere of air for 3 minutes, there is no afterimage regardless of whether the atmosphere is air or vacuum at the time of afterimage observation, whereas when the 505 K black body is imaged in the atmosphere of vacuum for 3 minutes, the afterimage appears regardless of whether the atmosphere is air or vacuum at the time of afterimage observation. It is therefore considered that a temperature rise of the part in which heat is not easily diffused is associated with the afterimage.

[Sixth Experiment]

Next, to check if an afterimage appears in an equally similar manner even for a subject at a room temperature and a low temperature, whether the afterimage would appear or not was checked when a person was the subject and a cooled background was observed at the time of afterimage observation and when an object which was cooled in liquid nitrogen was the subject and the background at the room temperature was observed at the time of afterimage observation. The results are shown in Table 3.

TABLE 3

| Subject (imaging time is three minutes) | Background at the time of afterimage observation | Afterimage |
| --- | --- | --- |
| Person | Lens is covered with a board cooled off in liquid nitrogen | None |
| Teflon beaker cooled off in liquid nitrogen | Lens is covered with a board of room temperature (24° C.) | Black afterimage with lower temperature than peripheral temperature (however, S/N ratio is small) |

As shown in Table 3, although there is a difference in temperature between the subjects at the time of imaging and the backgrounds at the time of afterimage observation, an afterimage does not appear or only a slight afterimage appears, so that it is considered that the afterimage depends on a temperature rise of the infrared detecting element 2.

[Seventh Experiment]

Judging the above-described results comprehensively, it seems from the first experiment that the afterimage is not caused by the operation of the infrared camera, and it seems from the second, third, fifth, and sixth experiments that the influence of the temperature rise of a diaphragm (the temperature detector 19) thermally separated from the circuit substrate 11 is greater than that of the circuit substrate 11 where heat is easily diffused. From the fourth experiment, it can be considered that the afterimage is associated with the temperature of the temperature detector 19 in itself rather than a temperature difference caused by the infrared incidence. Because the temperature correction value and the time constant of the afterimage changes if the temperature of the temperature detector 19, namely, the control temperature of the Peltier device 3 is changed, therefore, it is considered that the afterimage can be reduced by changing the control temperature at the time of afterimage appearance. Accordingly, measurements were made on how the afterimage would change after having imaged the black body at 505 K for 3 minutes when the control temperature of the Peltier device 3 was changed. The results are shown in FIG. 16 and Table 4.

TABLE 4

| Temperature of the Peltier device when imaging for 3 minutes - 505 K | Temperature of the Peltier device at the time of afterimage observation | Temperature correction value of the afterimage (T0) | Time constant of the afterimage ($\tau$) |
|---|---|---|---|
| 10° C. | 40° C. | Almost no afterimage | — |
| 40° C. | 50° C. | Almost no afterimage | — |
| 40° C. | 10° C. | 0.72° C. | 320 sec |

Figure 16:
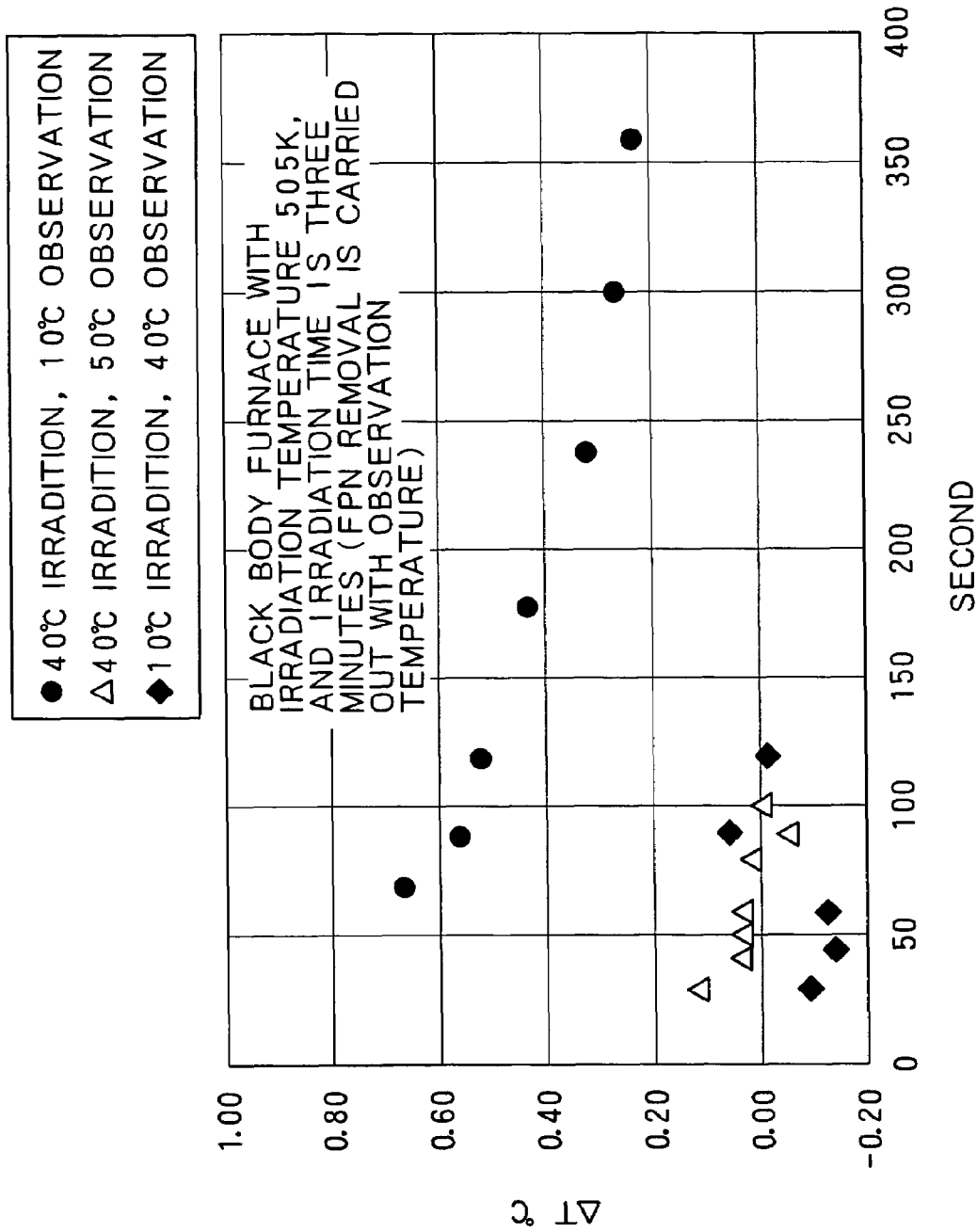
FIG. 16 is a graph showing the afterimage reducing effect when the set temperature of the Peltier device is changed.

As shown in FIG. 16 and Table 4, the afterimage did not disappear when the control temperature of the Peltier device 3 (in other words, the temperature of the infrared detecting element 2) was lowered after having imaged the high temperature object (the black body at 505 K) (see black circles in FIG. 16 and the lower row in Table 4). However, it was found out that the afterimage disappeared when the temperature of the Peltier device 3 was raised after having imaged the high temperature object (for example, white triangles in FIG. 16 or +10° C. from 40° C. to 50° C. in the middle row in Table 4, black rectangles in FIG. 16 or +30° C. from 10° C. to 40° C. in the upper row in Table 4). Although the cause for such an effect is not completely clear, however, it is not simply a thermal matter but is considered to have occurred as follows.

(First Assumption)

Heat accumulates in one of the surface of the diaphragm (the temperature detector 19) or the surface of the circuit substrate 11, or a part between the circuit substrate 11 and the diaphragm, and pixels where the afterimage appears are always in a temperature offset state.

(Second Assumption)

Heat accumulates in the diaphragm at the time of imaging a high temperature object, carrier traps accompanied with hopping conduction and thermal and optical excitation, which leads to a metastable potential, change the properties of the bolometer thin film (vanadium oxide) which constitutes the diaphragm. The changed properties do not return to the original properties promptly even when setting the control temperature of the Peltier device 3 low or releasing the heat to the atmosphere, after removing the high temperature object.

(Third Assumption)

Warpage occurs by the heat at the time of imaging a high temperature object, so that internal distortion occurs in the constituents of the infrared detecting element 2, such as vanadium oxide and a silicon nitride film, thus changing the property value.

(Fourth Assumption)

Because of the hysteresis of resistance of vanadium oxide, dielectric constants of vanadium oxide and the silicon nitride film, and the level of the interface between the vanadium oxide and the silicon nitride film, these property values do not return to the original ones immediately even if the high temperature object is removed.

(Fifth Assumption)

A factor that is the combination of the first to fourth assumptions stated above is the cause.

As apparent from the above, the mechanism is not completely clear, but at least it is understood that the afterimage can be reduced by making the temperature of the infrared detecting element 2 higher than that at the time of imaging after the high temperature object is imaged based on findings of the inventors of the present invention acquired by the experiments.

A bolometer infrared detector and an afterimage reduction method using the bolometer infrared detector according to the present invention will be explained below, and concrete methods of raising the temperature of the infrared detecting element 2 will also be explained.

FIRST EMBODIMENT

Figure 1B:
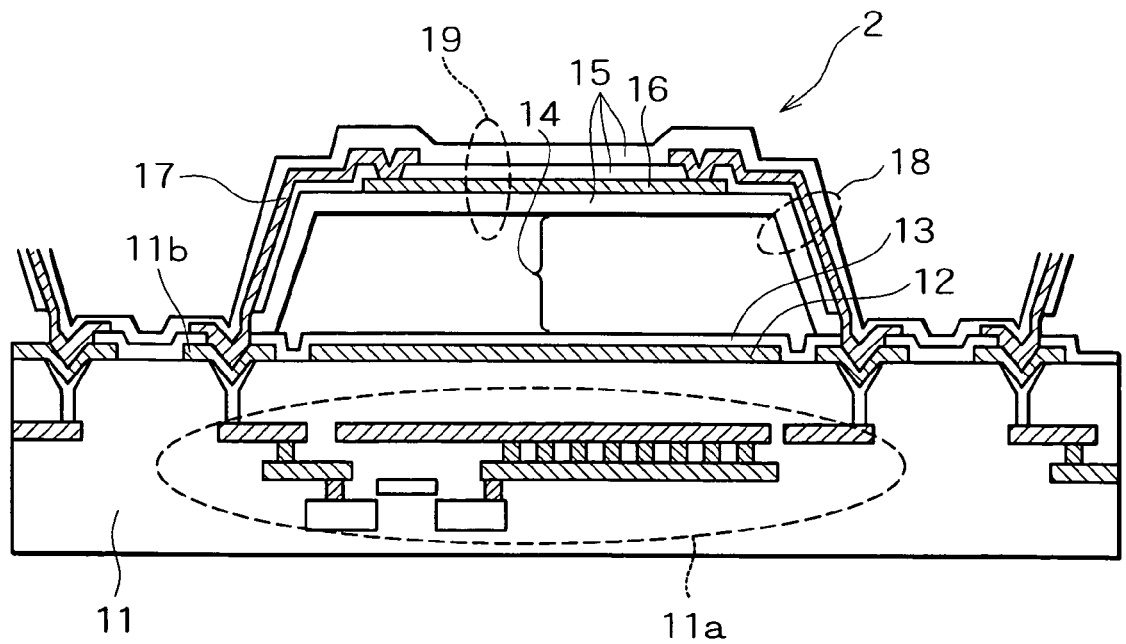
Figure 3:
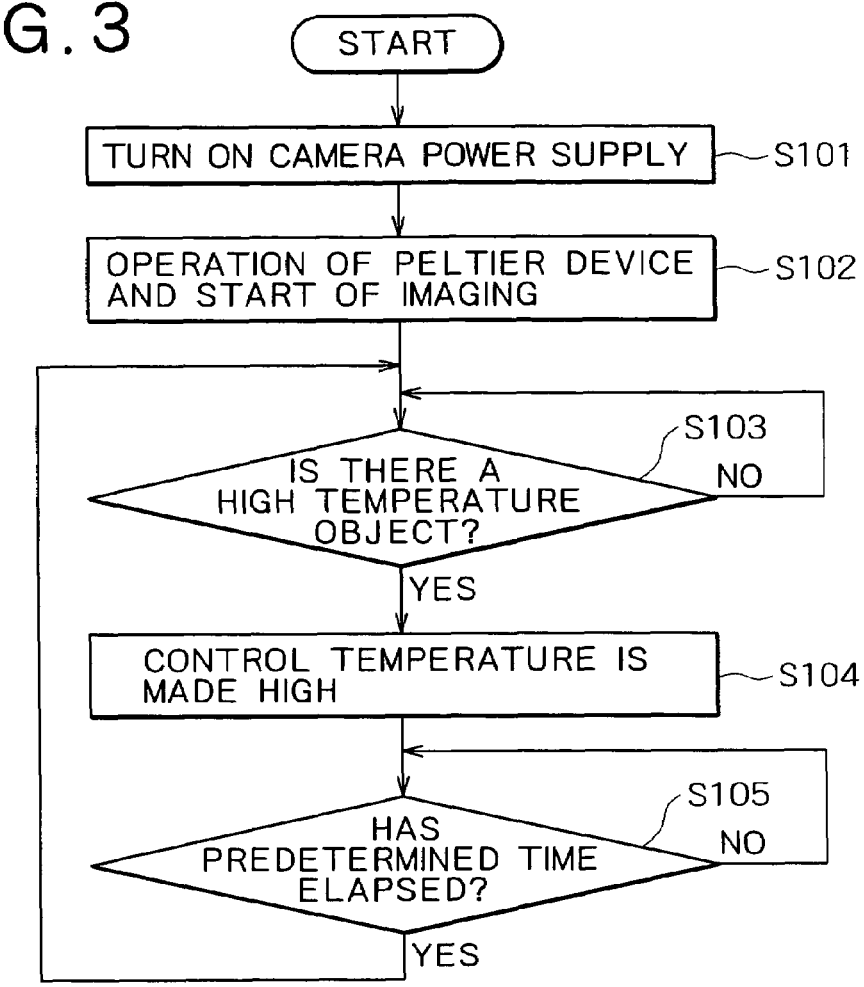
FIG. 3 is a flowchart showing procedures of an afterimage reduction method according to the first embodiment of the present invention.
Figure 4:
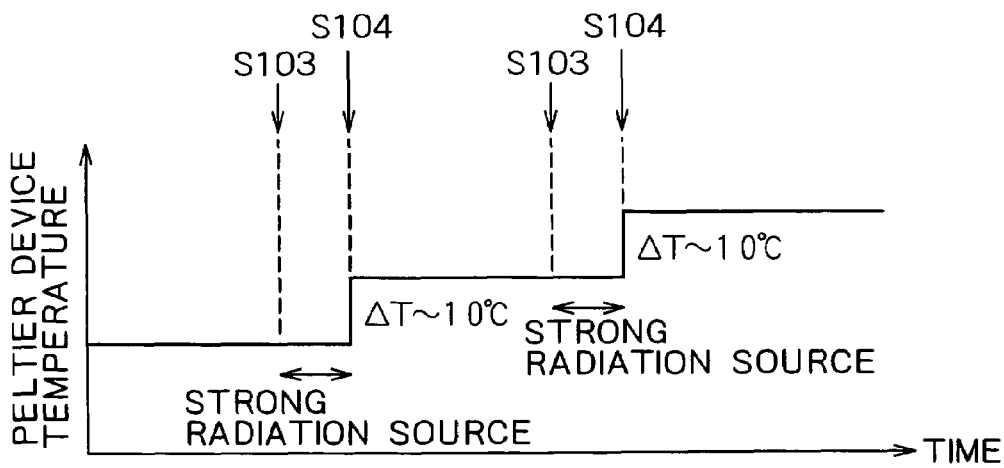
FIG. 4 is a graph showing a change in control temperature of a Peltier device according to the first embodiment of the present invention.

At first the bolometer infrared detector and the afterimage reduction method using the bolometer infrared detector according to the first embodiment of the present invention will be explained with reference to FIG. 1A to FIG. 4. FIGS. 1A and 1B are cross sectional views exemplarily showing the structures of the bolometer infrared detector and the infrared detecting element of the first embodiment. FIG. 2 is a block diagram showing the configuration of an external circuit of the infrared detector. FIG. 3 is a flowchart showing procedures of the afterimage reduction method. FIG. 4 is a graph showing a change in control temperature of a Peltier device.

As shown in FIG. 1A, the bolometer infrared detector 1 comprises the infrared detecting element 2 detecting infrared rays incident thereto via an optical system, a temperature control element, such as the Peltier device 3 which controls the temperature of the infrared detecting element 2, a vacuum package which comprises the package 4, the cap 5, the infrared-transparent window 6, and the exhaust pipe 7 and seals the infrared detecting element 2 and the Peltier device 3 in vacuum or under a reduced pressure, and the pins 8 which connect the infrared detecting element 2 and the Peltier device 3 to the external circuit. As shown in FIG. 1B, the infrared detecting element 2 comprises a circuit substrate 11 which has a readout circuit 11a formed therein and an infrared reflecting film 12 reflecting infrared rays, a protective film 13 and a contact 11b formed on the surface thereof, a temperature detector 19 consisting a bolometer thin film 16, an electrode 17 and a protective film 15 covering those components, and beams 18 holding the temperature detector 19 so as to be separated from the circuit substrate 11. FIG. 1A shows one of examples of the bolometer infrared detector 1 according to the present invention, and the concrete configuration of the bolometer infrared detector 1 is not limited to the one in FIG. 1A as long as the temperature of the infrared detecting element 2 having a thermal isolation structure is controlled by a temperature control element.

Based on the experimental results, the afterimage can be reduced by raising the temperature of the infrared detecting element 2 when an afterimage appears. Therefore, in the present embodiment, as shown in FIG. 2, the external circuit 9 connected to the infrared detecting element 2 and the Peltier device 3 comprises at least a driver 21 which drives the infrared detecting element 2, a signal processor 22 which processes infrared image signals output from the infrared detecting element 2, a temperature control element driver 24 which drives the Peltier device 3, a high temperature object detector 23 which detects a high temperature object whose temperature is equal to or higher than a predetermined temperature or whose output voltage is equal to or higher than a value corresponding to the predetermined temperature, and a control temperature setter 25 which performs control to raise the temperature of the Peltier device 3 by a predetermined temperature when a high temperature object is detected.

Among the components described above, the driver 21, the signal processor 22, and the temperature control element driver 24 are components that ordinary infrared detectors have, and in addition to those components, the present embodiment comprises the high temperature object detector 23 and the control temperature setter 25. The external circuit 9 may include a component other than the above-described components, or these components may be independent, or these components may not be clearly separated in the external circuit 9. Although the driver 21 is provided on the external circuit 9 for the sake of convenience here, a part of the driver 21 may be comprised in the readout circuit 11a.

The high temperature object detector 23 detects a subject which needs the afterimage reducing processing of the present embodiment when the temperature is equal to or higher than a predetermined temperature or the output voltage is equal to or higher than a value corresponding to the predetermined temperature by referring to the temperature of the subject provided from the output of the signal processor 22, the predetermined temperature with which the subject is detected as a high temperature object can be set in view of the performance and usage of the infrared detector 1. For example, when the control temperature of the Peltier device 3 is low, the reference temperature of a high temperature object may be set high because of the small influence of the afterimage, or when control temperature of the Peltier device 3 is high, the reference temperature of a high temperature object may be set low because of the large influence of the afterimage, both based on the results of Table 1 and FIG. 11. There is no need for setting the reference temperature constant, so that the reference temperature of a high temperature subject may be lower or higher, namely, variable, in every afterimage reduction processing because the afterimage reduction method of the present embodiment raises gradually the control temperature of the Peltier device 3.

Moreover, the size of the high temperature object is not limited either, and an object may be taken as a high temperature object when just one pixel of the array of infrared detecting elements 2 becomes higher than the reference temperature, or when it is not preferable to change the setting of the whole infrared detector 1 for an object of a minute size, an object may be taken as a high temperature object when the temperature of an object of a predetermined size or a predetermined number of pixels becomes higher than the reference temperature.

Further, afterimage reduction processing may be performed immediately when the predetermined temperature, the predetermined output voltage, or the predetermined size of a high temperature object is detected, or afterimage reduction processing may be performed only in the case where the predetermined temperature, the predetermined output voltage, or the predetermined size of a high temperature object is detected and the temperature correction value of an afterimage is equal to or higher than a prescribed value even when a predetermined time (for example, 1 second) elapses after the detection. Through such a decision, when a high temperature object is imaged instantaneously but the influence of an afterimage disappears immediately because of the very short time, the object can be judged as not requiring afterimage reduction processing, and only an afterimage with an effectively large influence is reduced.

The control temperature setter 25 performs a control to raise the control temperature of the temperature control element driver 24 by a predetermined temperature when a high temperature object is detected by the high temperature object detector 23. This temperature to be raised, too, can be set in view of performance and usage of the infrared detector 1. When control temperature of the Peltier device 3 before change is low, for example, the temperature to be raised may be set small because the small influence of the afterimage, or when the control temperature of the Peltier device 3 before change is high, the temperature to be raised may be set large because the large influence of the afterimage, as shown in the results of FIG. 11 and Table 1. When control temperature of the Peltier device 3 before change is low, the temperature to be raised may be set large because the temperature can be raised high, or when control temperature of the Peltier device 3 before change is high, the temperature to be raised may be set small because the temperature cannot be raised so much. It is unnecessary to always set the temperature to be raised constant, so that the temperature to be raised may gradually become smaller in every afterimage reduction processing because the afterimage reduction method of the present embodiment raises gradually the control temperature of the Peltier device 3.

Concrete procedures to reduce an afterimage with the infrared detector 1 comprising the external circuit 9 with above-described structure will be described next with reference to a flowchart of FIG. 3 and a graph of FIG. 4 showing a change in control temperature of the Peltier device 3.

First, at step S101, a power supply of the infrared camera is turned on. Then, at step S102, the temperature control element driver 24 drives the Peltier device 3 to control the infrared detecting element 2 in such a way as to become the predetermined temperature, the driver 21 transmits a predetermined signal to the infrared detecting element 2, the infrared detecting element 2 transmits a change in the voltage, which represents a temperature change in the temperature detector 19 caused by infrared rays input through an incidence optical system, to the signal processor 22 to image the subject.

Next, at step S103, the high temperature object detector 23 judges whether or not a subject (a high temperature object) with the temperature higher than a predetermined temperature or with the output voltage equal to or higher than a value corresponding to the predetermined temperature is imaged in the subject based on the output of the signal processor 22. When a subject whose the temperature is equal to or higher than a predetermined temperature or whose output voltage is equal to or higher than a value corresponding to the predetermined temperature, the subject is judged as a high temperature object. At step S104, the control temperature setter 25 transmits a control signal to the temperature control element driver 24 to raise the control temperature by the predetermined temperature. The temperature to be raised can be set in view of performance and usage of the infrared detector 1 as described above; for example, it may be about 10° C.

Next, after the control temperature of the Peltier device 3 is changed, the process can return to step S103 immediately. The afterimage does not disappear immediately since a predetermined time is necessary for the temperature of the infrared detecting element 2 to rise even when the control temperature is changed, so that after the control temperature setter 25 has counted the time from the change in control temperature and a predetermined time has elapsed at step S105, the process may return to step S103 to perform high temperature object detection. Steps S103 to S105 are repeated to reduce the afterimage by raising the control temperature every time a high temperature object is detected as shown in FIG. 4.

The external circuit 9 of the infrared detector 1 according to the present embodiment comprises the high temperature object detector 23 and the control temperature setter 25 in addition to the driver 21, the signal processor 22, and the temperature control element driver 24, and when the high temperature object detector 23 detects a subject (a high temperature object) whose the temperature is equal to or higher than the predetermined temperature or whose output voltage is equal to or higher than a value corresponding to the predetermined temperature, the control temperature setter 25 performs such control as to raise the control temperature of the Peltier device 3, so that an afterimage can be reduced quickly even when a high temperature object is imaged, thus making it possible to acquire an infrared image with high reliability whose temperature can be measured accurately.

SECOND EMBODIMENT

Figure 5:
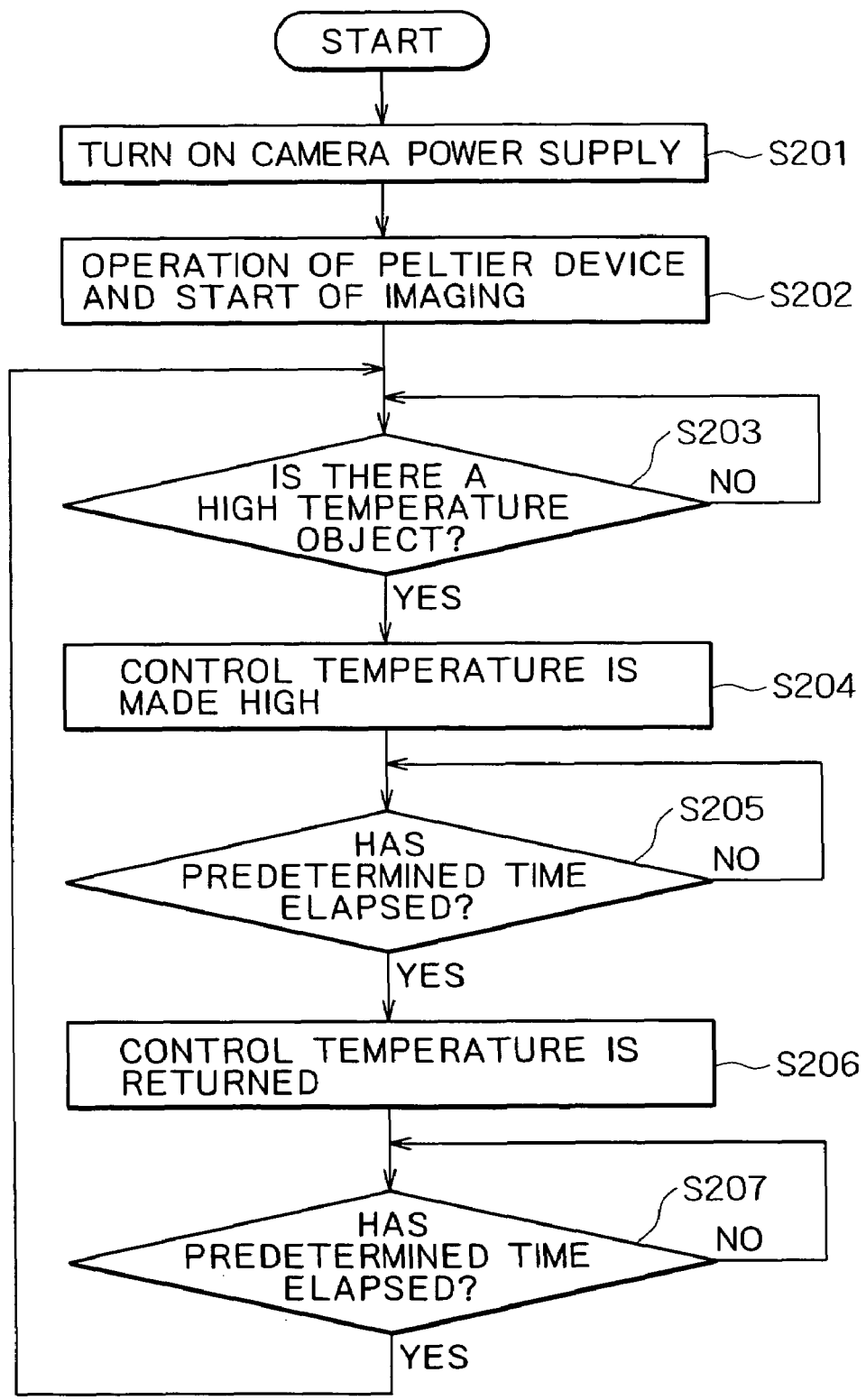
FIG. 5 is a flowchart showing procedures of an afterimage reduction method according to a second embodiment of the present invention.
Figure 6:
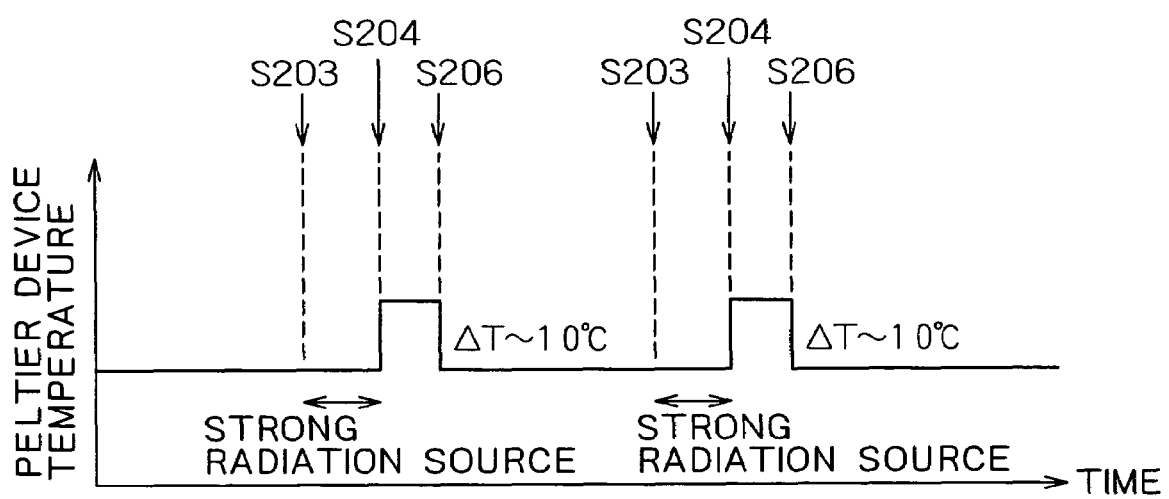
FIG. 6 is a graph showing the transition of the control temperature of a Peltier device according to the second embodiment of the present invention.

The bolometer infrared detector and the afterimage reduction method using the bolometer infrared detector according to the second embodiment of the present invention will be explained next with reference to FIG. 5 and FIG. 6. FIG. 5 is a flowchart showing procedures of the afterimage reduction method. FIG. 6 is a graph showing the transition of the control temperature of a Peltier device.

In the first embodiment described above, the control temperature of the Peltier device 3 is raised every time the high temperature object detector 23 detects a high temperature object to reduce the afterimage. However, by this method, the temperature of the infrared detecting element 2 rises gradually, resulting in that the temperature coefficient of resistance (TCR) of the bolometer thin film 16 (vanadium oxide) constituting the temperature detector 19 changes and the sensitivity changes gradually. Further, power consumption for temperature control becomes large if the control temperature of the Peltier device 3 is far from the normal temperature. Therefore, the infrared detector 1 is constructed in the present embodiment in such a way that the above-described problems do not occur while reducing an afterimage.

While the construction of the external circuit 9 according to the present embodiment is similar to that of the first embodiment, the control temperature setter 25 raises the control temperature by a predetermined temperature when the high temperature object detector 23 detects a high temperature object, and controls the control temperature to return back when a predetermined time elapses. In other words, the control temperature is not maintained at a raised control temperature in the present embodiment, but is increased in a pulse form only for a certain time.

Concrete procedures to reduce an afterimage with the infrared detector 1 comprising the control temperature setter 25 with above-described configuration will be described below with reference to a flowchart of FIG. 5 and a graph of FIG. 6 showing a change in control temperature of the Peltier device 3.

At first, at step S201, the power supply of the infrared camera is turned on. Then, at step S202, the temperature control element driver 24 drives the Peltier device 3 to control the infrared detecting element 2 so as to become the predetermined temperature, the driver 21 transmits a predetermined signal to the infrared detecting element 2, the infrared detecting element 2 transmits a change in the voltage, which represents a temperature change in the temperature detector 19 caused by infrared rays input through an incidence optical system, to the signal processor 22 to image the subject.

Next, at step S203, the high temperature object detector 23 judges whether or not a subject (a high temperature object) with the temperature equal to or higher than a predetermined temperature or with the output voltage equal to or higher than a value corresponding to the predetermined temperature is imaged in the subject based on the signal of the signal processor 22. When a temperature of a subject is equal to or higher than a predetermined temperature or an output voltage of the subject is equal to or higher than a value corresponding to the predetermined temperature, the subject is judged as a high temperature object. At step S204 the control temperature setter 25 transmits a control signal to the temperature control element driver 24 to raise the control temperature by a predetermined temperature while time after the control signal has transmitted is measured at step S205, and when a predetermined time elapses, the process goes to step S206. At step S206, a control signal is transmitted to the temperature control element driver 24 and the control temperature is returned to the original temperature. The temperature to be raised and the time for which the temperature is raised can be set in view of performance and usage of the infrared detector 1 as described above. However, the temperature of the infrared detecting element 2 does not rise immediately when the Peltier device 3 is raised, so that it is preferable to ensure a certain time as the time to raise the temperature; for example, it can be set to about 1 minute.

The afterimage does not disappear immediately even when the control temperature of the Peltier device 3 is changed as per the first embodiment, so that at step S207 the control temperature setter 25 may count the time since the change in control temperature and may return to step S203 to perform high temperature object detection after the predetermined time elapses. And, steps S203 to S207 are repeated to reduce the afterimage by raising the control temperature every time a high temperature object is detected as shown in FIG. 6.

Thus, the external circuit 9 of the infrared detector 1 according to the present embodiment comprises the high temperature object detector 23 and the control temperature setter 25, and when the high temperature object detector 23 detects a subject (a high temperature object) whose temperature is equal to or higher than the predetermined temperature or whose output voltage is equal to or higher than a value corresponding to the predetermined temperature, the control temperature setter 25 controls to raise the control temperature of the Peltier device 3, so that an afterimage can be reduced quickly even when a high temperature object is imaged. Moreover, because the control temperature is returned to the initial state after a certain time elapses, even if a high temperature object has been detected many times, the operation temperature of the infrared detecting element 2 does not become far from the normal temperature, so that the sensitivity does not vary and power consumption for temperature control does not increase excessively, thus making it possible to further stabilize the operation of the infrared detector 1.

THIRD EMBODIMENT

Figure 7:
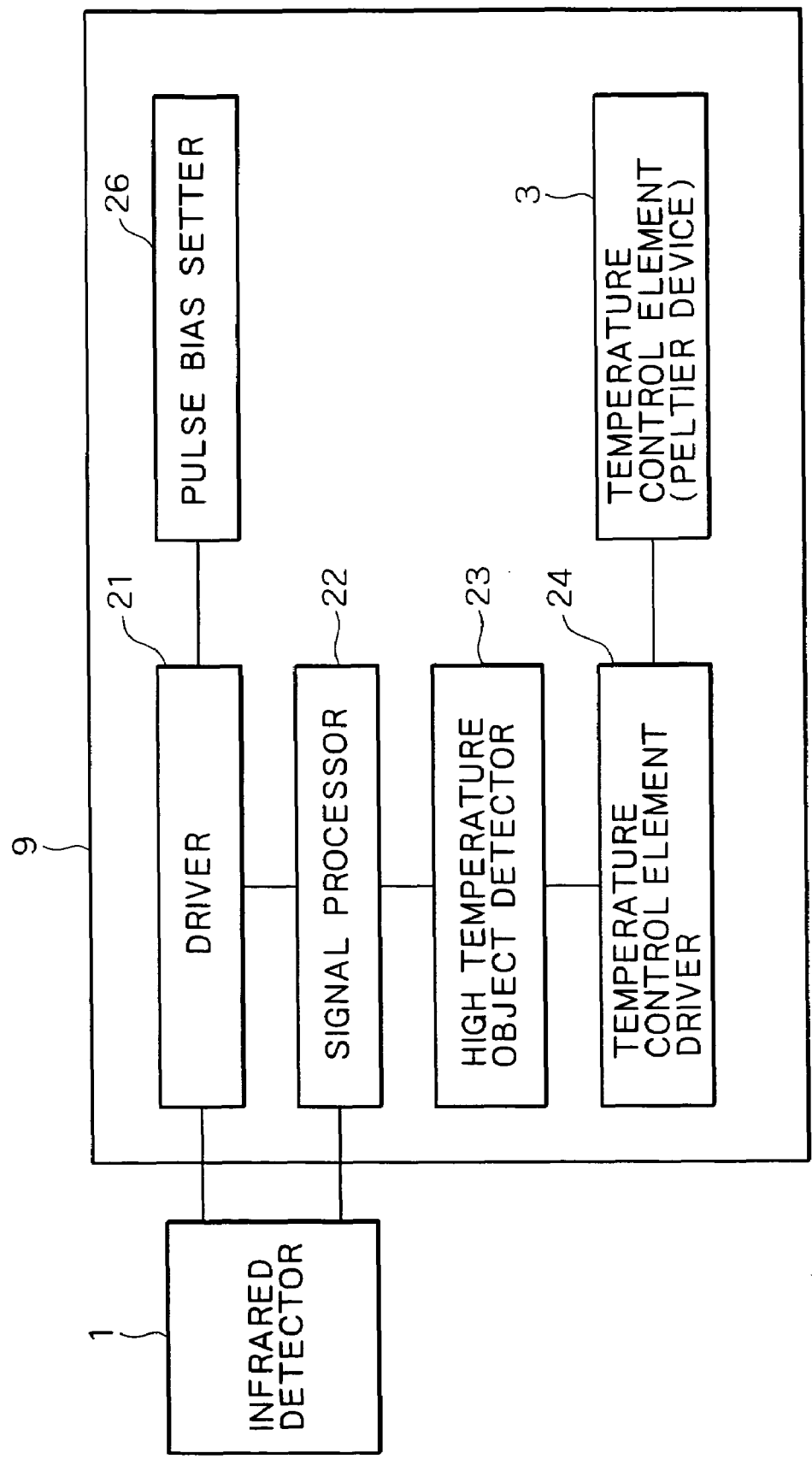
FIG. 7 is a block diagram showing the configuration of an external circuit of the infrared detector according to a third embodiment of the present invention.
Figure 8:
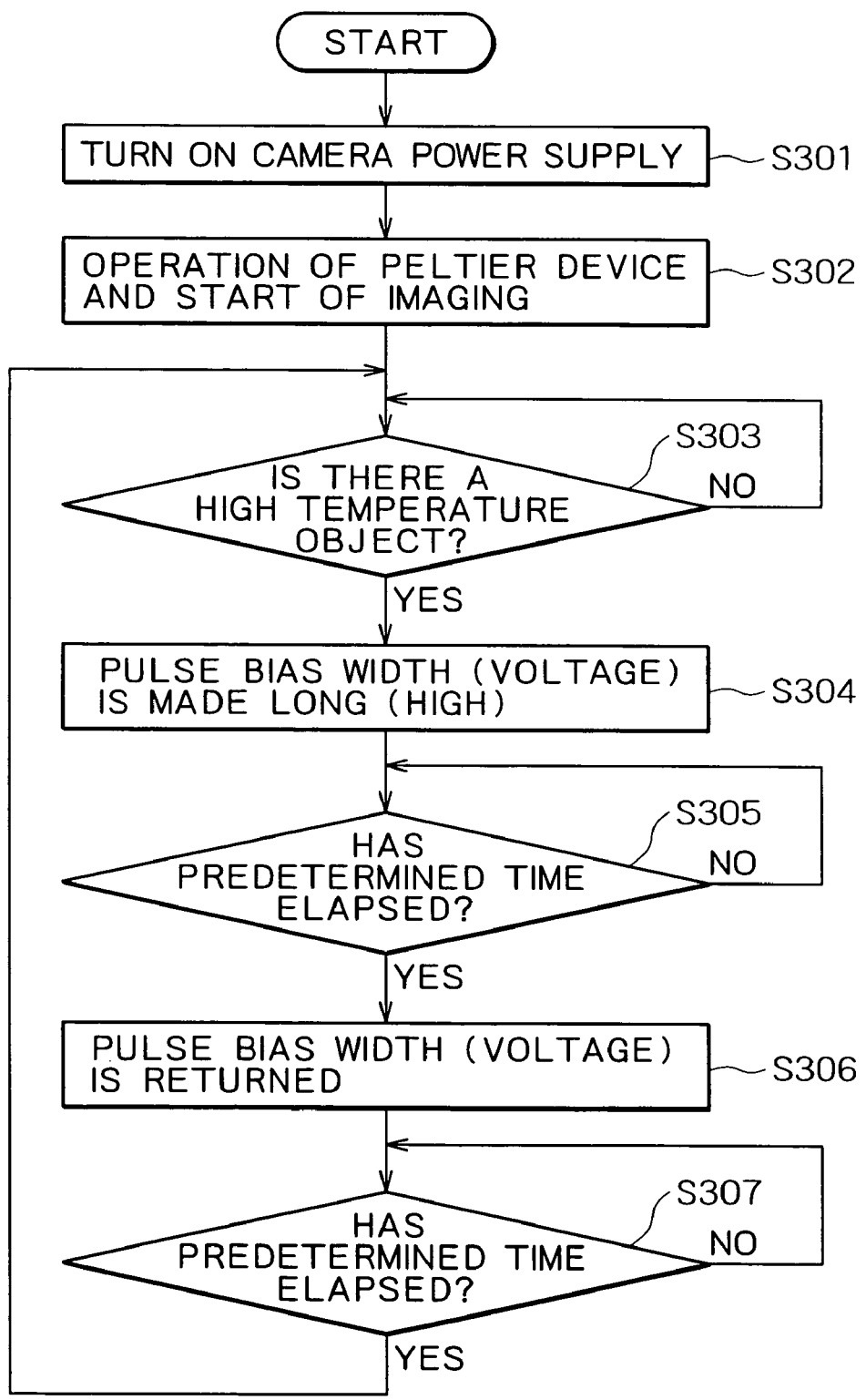
FIG. 8 is a flowchart showing procedures of an afterimage reduction method according to the third embodiment of the present invention.
Figure 9A:
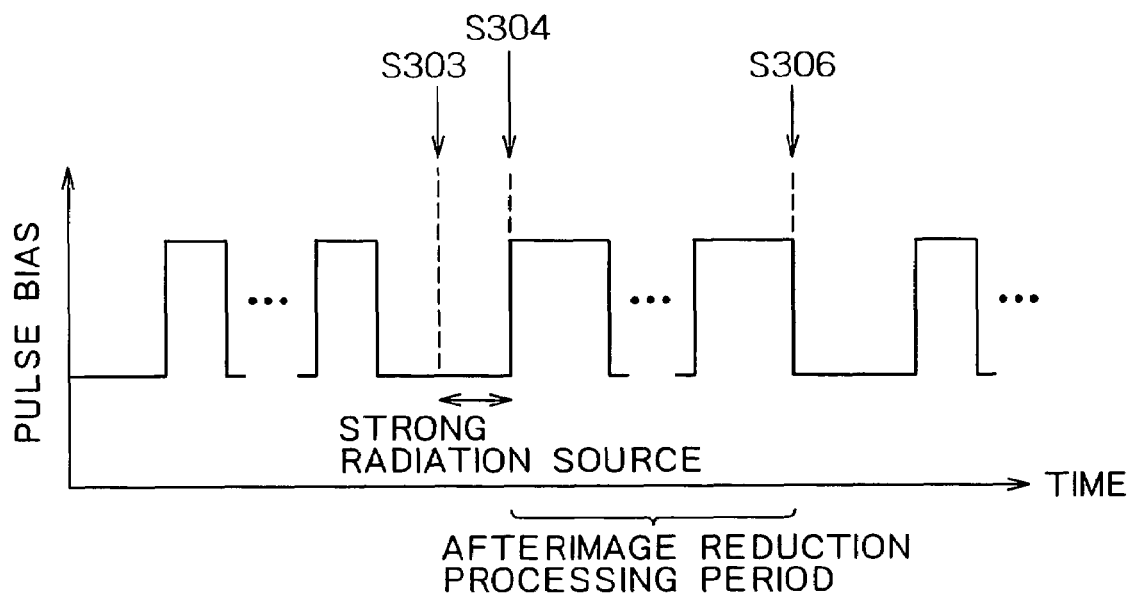
FIGS. 9A and 9B are graphs showing pulse bias waveforms according to the third embodiment of the present invention.
Figure 9B:
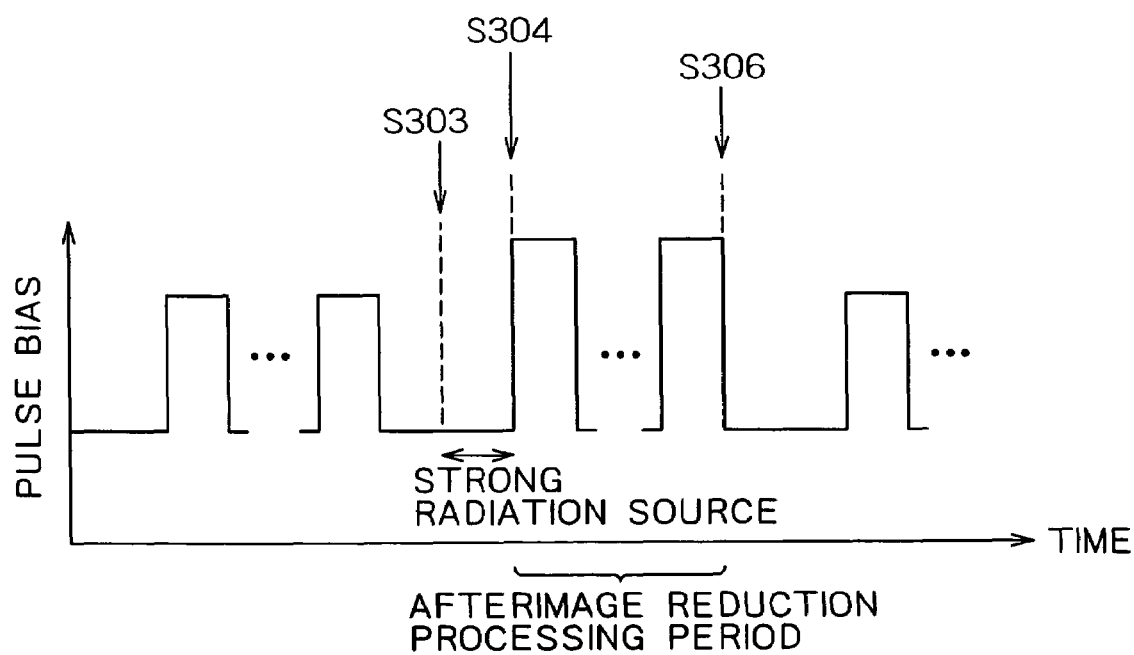
Figure 10:
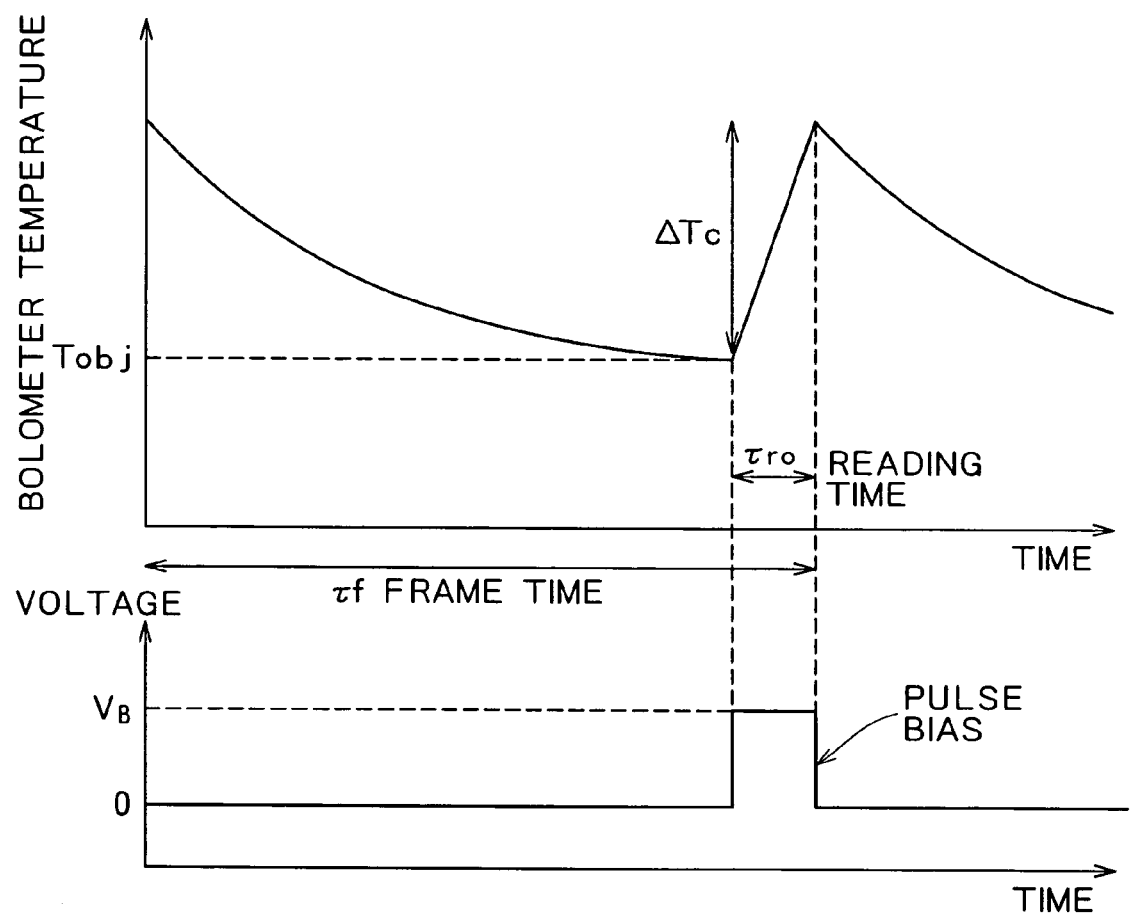
FIG. 10 is an explanatory graph showing a temperature cycle repeating temperature rise and fall frame by frame.

The bolometer infrared detector and the afterimage reduction method using the bolometer infrared detector according to the third embodiment of the present invention will be explained with reference to FIG. 7 to FIG. 10. FIG. 7 is a block diagram showing the constitution of an external circuit of the bolometer infrared detector. FIG. 8 is a flowchart showing procedures of the afterimage reduction method. FIGS. 9A and 9B are graphs showing pulse bias waveforms. FIG. 10 is an explanatory graph showing the operating principle of the infrared detecting element 2.

In the first and second embodiments described above, the control temperature of the Peltier device 3 is raised to increase the temperature of the infrared detecting element 2 when the high temperature object detector 23 detects a high temperature object, thereby reducing the afterimage. However, when the control temperature of the Peltier device 3 is changed, the temperature of the whole infrared detector 1, i.e., the temperature of not only the diaphragm (the temperature detector 19) but also the temperature of the beams 18 holding the diaphragm in the air and the circuit substrate 11 in which the readout circuit 11a is formed are changed, so that the time for the temperature to return to the original temperature becomes long. When the temperature of the beams 18 or the circuit substrate 11 is changed, problems, such as a change in the form of the beam 18 and a change in properties of the readout circuit 11a occur. Therefore, the infrared detector 1 is constructed in the present embodiment in such a way that the above-described problems do not occur while reducing an afterimage.

Specifically, as shown in FIG. 7, the external circuit 9 comprises the driver 21 which drives the infrared detecting element 2 by the pulse bias, the signal processor 22 which processes infrared image signals output from the infrared detecting element 2, the temperature control element driver 24 which drives the Peltier device 3, as well as the high temperature object detector 23 which detects a high temperature object whose the temperature is equal to or higher than a predetermined temperature or whose output voltage is equal to or higher than a value corresponding to the predetermined temperature, and a pulse bias setter 26 which performs such control as to change the pulse width or pulse peak voltage of pulse bias applied to the infrared detecting element 2 when a high temperature object is detected (i.e., the pulse width of pulse bias is made longer or the peak voltage of the pulse is made higher). In addition, in the present embodiment also, the external circuit 9 may include a component other than the above-described components, or these components may be independent, or these components may not be clearly divided in the external circuit 9.

Now, the operating principle of the infrared detecting element 2 will be explained with reference to FIG. 10. As shown in FIG. 10, a pulse bias voltage or a current is applied to the bolometer (for every τf frame time), accompanied with this pulse bias temperature rising and lowering are repeated with temperature change width ΔTc, and signals of the infrared detecting element 2 are read out during reading time τro. In the tolerance of the temperature change width ΔTc and the reading time τro, if the pulse width or the pulse peak voltage of the pulse bias is made large, the temperature of the bolometer thin film 16 can be raised, and the same effect as that of the case where the control temperature of the Peltier device 3 is raised can be acquired. Therefore, in the present embodiment, the external circuit 9 comprises the pulse bias setter 26 instead of the control temperature setter 25 shown in the first and second embodiments.

Specific procedures to reduce an afterimage with the infrared detector 1 comprising the pulse bias setter 26 with the above-described constitution will be explained with reference to a flowchart of FIG. 8 and timing charts of the pulse bias in FIGS. 9A and 9B.

First, at step S301, the power supply of the infrared camera is turned on. Then, at step S302, the temperature control element driver 24 drives the Peltier device 3 to control the infrared detecting element 2 so as to become the predetermined temperature, the driver 21 transmits a predetermined signal to the infrared detecting element 2, the infrared detecting element 2 transmits a change in the voltage, which represents a temperature change in the temperature detector 19 caused by infrared rays input through an incidence optical system, to the signal processor 22 to image the subject.

Next, at step S303, the high temperature object detector 23 judges whether or not a subject (a high temperature object) with a temperature equal to or higher than a predetermined temperature or with the output voltage equal to or higher than a value corresponding to the predetermined temperature by referring to the output of the signal processor 22 is imaged in the subject. When a subject whose the temperature is equal to or higher than a predetermined temperature or whose output voltage is equal to or higher than a value corresponding to the predetermined temperature, the subject is judged as a high temperature object. At step S304 the pulse bias setter 26 transmits a control signal to the driver 21 to change the pulse width or the pulse peak voltage of the pulse bias to a predetermined value while the time since transmission of the control signal is measured at step S305, and when a predetermined time elapses, the process goes to step S306. At step S306, a control signal is transmitted to the driver 21 and the pulse width or the pulse peak voltage of the pulse bias is returned to the original value.

The pulse width and the pulse peak voltage of the pulse bias can be set in view of performance and usage of the infrared detector 1; for example, in the case of the infrared detecting element 2 with 640×480 pixels and 23.5 μm pitch, where the resistance value of the bolometer thin film 16 is 70 kΩ at 25° C.; TCR is −1.7%/K at 25° C.; Gth (thermal conductance) is 0.04 μW/K; Cth (thermal capacity) is 4×10$^{-10}$J/K; the control temperature of the Peltier device 3 is 40° C.; the integral time of signal is 11 μsec; and the peak voltage of the pulse bias is 4V, a temperature rise of the temperature detector 19 is 8.5° C., a temperature rise of the temperature detector 19 is 20.9° C. when the peak voltage of the pulse bias is 6V. Thus if the peak voltage of the pulse bias is raised to 6V from 4V, the temperature of the temperature detector 19 can be raised by 12.4° C. Likewise in the case of the infrared detecting element 2 with 320×240 pixels, where the resistance value of the bolometer thin film 16 is 70 kΩ at 25° C.; TCR is −1.7%/K at 25° C.; Gth is 0.1 μW/K; Cth is 1.2×10$^{-9}$ J/K; the control temperature of the Peltier device 3 is 40° C.; the integral time of the signal is 26 μsec; and the peak voltage of the pulse bias is 4V, a temperature rise of the temperature detector 19 is 6.6° C., likewise a temperature rise of the temperature detector 19 is 15.9° C. when the peak voltage of the pulse bias is 6V, thus if the peak voltage of the pulse bias is raised to 6V from 4V, the temperature of the temperature detector 19 can be raised by 9.3° C.

The afterimage does not disappear immediately after the pulse width or the pulse peak voltage of pulse bias changes as per the first and second embodiments, so that after the pulse bias setter 26 may count the time since the change in pulse bias may return to step S303 to perform high temperature object detection after a predetermined time elapses at step S307. Steps S303 to S307 are repeated to reduce the afterimage by making the width of pulse bias longer for a certain time ("afterimage reduction processing period" in FIGS. 9A and 9B) every time a high temperature object is detected as shown in FIG. 9A or by making the peak voltage of the pulse bias larger for a certain time every time a high temperature object is detected as shown in FIG. 9B.

In addition, in the above-described flow, after having changed the pulse width or the pulse peak voltage of the pulse bias, when a certain time elapses, the pulse width or the pulse peak voltage is returned to the initial value. However, as in the first embodiment, the pulse width or pulse peak voltage changed is maintained for a time, and if a high temperature object is detected again, the pulse width or pulse peak voltage may be controlled to become larger. Although one of the pulse width and the pulse peak voltage of the pulse bias is changed in the explanation described above, both of the pulse width and the pulse peak voltage of the pulse bias may be controlled in combination; for example, both may be changed at the same time or alternately.

Thus, the external circuit 9 of the infrared detector 1 according to the present embodiment comprises the high temperature object detector 23 and the pulse bias setter 26, and when the high temperature object detector 23 detects a subject (a high temperature object) whose temperature is equal to or higher than the predetermined temperature or whose output voltage is equal to or higher than a value corresponding to the predetermined temperature, the pulse bias setter 26 controls the pulse width or the pulse peak voltage of the pulse bias to be large for a certain time, so that an afterimage can be reduced quickly even when a high temperature object is imaged and the afterimage can be reduced easily and with reliability. This makes it possible to acquire an infrared image with high reliability whose temperature can be measured accurately.

Although afterimage reduction processing is performed by using the high temperature object detector 25 and the pulse bias setter 26 only when a high temperature object is detected by the high temperature object detector 25 in each embodiment described above, the present invention is not limited to the above-described embodiments, but afterimage reduction processing may be performed regularly considering that some afterimage appears even if an object whose temperature is equal to or less than a predetermined temperature or whose output voltage is equal to or lower than a predetermined voltage is imaged.

In the second and third embodiments, the control temperature of the Peltier device 3 and the pulse width or pulse peak voltage of the pulse bias is returned to the original state after a certain time elapses. However, complete return to the original state is not required, so that, for example, combining the first embodiment with the second embodiment, the temperature may be made higher than the original temperature but lower than the raised temperature, or after raising the temperature, the temperature may be temporarily made lower than the original temperature and may then be returned to the original temperature afterwards.

Further, although the control temperature of the Peltier device 3 is changed in the first and second embodiments and the pulse width and pulse peak voltage of the pulse bias is changed in the third embodiment, they may be controlled in combination; for example, the control temperature of the Peltier device 3 and the pulse width and pulse peak voltage of the pulse bias may be changed at the same time or alternately.

Furthermore, in each embodiment discussed above, the infrared detecting element 2 is raised by raising the control temperature of the Peltier device 3, or the pulse width of the pulse bias is increased, or the pulse peak voltage is increased. However, another component or method may be used to raise the infrared detecting element 2; for example, a heating element, such as a heater, may be used to heat up the infrared detecting element 2.

What is claimed is:

1. A bolometer infrared detector comprising:

an infrared detecting element including a substrate, and a diaphragm having a bolometer thin film and supported on said substrate by beams;

a detector which detects, in a subject, a high temperature object whose temperature is equal to or higher than a predetermined temperature or a high temperature object whose output voltage is equal to or higher than a predetermined value corresponding to said predetermined temperature; and a controller which raises a temperature of the infrared detecting element at least for a certain time when the high temperature object is detected.

2. A bolometer infrared detector comprising:

an infrared detecting element including a substrate, and a diaphragm having a bolometer thin film and supported on said substrate by beams;

a temperature controller which controls a temperature of the infrared detecting element;

a high temperature object detector which detects, in a subject, a high temperature object whose temperature is equal to or higher than a predetermined temperature or a high temperature object whose output voltage is equal to or higher than a predetermined value corresponding to said predetermined temperature with reference to an output signal from the infrared detecting element; and a control temperature setter which performs control when said high temperature object is detected in such a way as to raise a control temperature of said temperature controller by a predetermined temperature.

3. A bolometer infrared detector comprising:

an infrared detecting element including a substrate, and a diaphragm having a bolometer thin film and supported on said substrate by beams;

a temperature controller which controls a temperature of said infrared detecting element;

a high temperature object detector which detects, in a subject, a high temperature object whose temperature is equal to or higher than a predetermined temperature or a high temperature object whose output voltage is equal to or higher than a predetermined value corresponding to said predetermined temperature with reference to an output signal from the infrared detecting element; and a control temperature setter which performs control when said high temperature object is detected in such a way as to raise a control temperature of said temperature controller by a predetermined temperature and to set said control temperature to an original temperature after a certain time elapses.

4. A bolometer infrared detector comprising:
an infrared detecting element which includes a substrate, and a diaphragm having a bolometer thin film and supported on said substrate by beams, and is driven by a pulsed bias voltage;
a high temperature object detector which detects, in a subject, a high temperature object whose temperature is equal to or higher than a predetermined temperature or a high temperature object whose output voltage is equal to or higher than a predetermined value corresponding to said predetermined temperature with reference to an output signal from said infrared detecting element; and
a pulse bias setter which performs control when the high temperature object is detected in such a way as to increase a width of said pulse by a predetermined time and to set said width of said pulse back to an original width after a certain time elapses.

5. A bolometer infrared detector comprising:
an infrared detecting element which includes a substrate, and a diaphragm having a bolometer thin film and supported on the substrate by beams and is driven by a pulsed bias voltage;
a high temperature object detector which detects, in a subject, a high temperature object whose temperature is equal to or higher than a predetermined temperature or a high temperature object whose output voltage is equal to or higher than a predetermined value corresponding to said predetermined temperature with reference to an output signal from said infrared detecting element; and
a pulse bias setter which performs control when said high temperature object is detected in such a way as to increase a peak voltage of said pulse by a predetermined voltage, and to set said peak voltage of said pulse back to an original voltage after a certain time elapses.

6. An afterimage reduction method using a bolometer infrared detector comprising an infrared detecting element including a substrate, and a diaphragm having a bolometer thin film and supported on said substrate by beams, comprising the steps of:
detecting, in a subject, a high temperature object whose temperature is equal to or higher than a predetermined temperature or a high temperature object whose output voltage is equal to or higher than a predetermined value corresponding to said predetermined temperature; and
raising a temperature of said infrared detecting element at least for a certain time when said high temperature object is detected.

7. An afterimage reduction method using a bolometer infrared detector comprising an infrared detecting element including a substrate, and a diaphragm having a bolometer thin film and supported on said substrate by beams, and a temperature controller which controls a temperature of said infrared detecting element to a predetermined temperature, comprising the steps of:
detecting, in a subject, a high temperature object whose temperature is equal to or higher than a predetermined temperature or a high temperature object whose output voltage is equal to or higher than a predetermined value corresponding to said predetermined temperature with reference to an output signal from said infrared detecting element; and
raising a control temperature of said temperature controller by a predetermined temperature when said high temperature object is detected.

8. An afterimage reduction method using a bolometer infrared detector comprising an infrared detecting element including a substrate, and a diaphragm having a bolometer thin film and supported on said substrate by beams, and a temperature controller which controls a temperature of said infrared detecting element to a predetermined temperature, comprising the steps of:
detecting, in a subject, a high temperature object whose temperature is equal to or higher than a predetermined temperature or a high temperature object whose output voltage is equal to or higher than a predetermined value corresponding to said predetermined temperature with reference to an output signal from said infrared detecting element;
raising a control temperature of said temperature controller by a predetermined temperature when said high temperature object is detected; and
setting said control temperature back to an original temperature after a certain time elapses.

9. An afterimage reduction method using a bolometer infrared detector comprising an infrared detecting element which includes a substrate, and a diaphragm having a bolometer thin film and supported on said substrate by beams, and is driven by a pulsed bias voltage, comprising the steps of:
detecting, in a subject, a high temperature object whose temperature is higher than a predetermined temperature or a high temperature object whose output voltage is equal to or higher than a predetermined value corresponding to said predetermined temperature with reference to an output signal from said infrared detecting element;
increasing a pulse width by a predetermined time when said high temperature object is detected; and
setting said pulse width back to an original width after a certain time elapses.

10. An afterimage reduction method using a bolometer infrared detector comprising an infrared detecting element which includes a substrate, and a diaphragm having a bolometer thin film and supported on said substrate by beams and is driven by a pulsed bias voltage, comprising the steps of:
detecting, in a subject, a high temperature object whose temperature is equal to or higher than a predetermined temperature or a high temperature object whose output voltage is equal to or higher than a predetermined value corresponding to said predetermined temperature with reference to an output signal from said infrared detecting element;
increasing a peak voltage of said pulse high by a predetermined voltage when said high temperature object is detected; and
setting said peak voltage of said pulse back to an original voltage after a certain time elapses.

* * * * *